(12) United States Patent
Hagihara

(10) Patent No.: US 7,164,443 B1
(45) Date of Patent: Jan. 16, 2007

(54) IMAGE-SENSING APPARATUS

(75) Inventor: Yoshio Hagihara, Osaka (JP)

(73) Assignee: Minolta Co., Ltd., Osaka (JP)

( * ) Notice: Subject to any disclaimer, the term of this patent is extended or adjusted under 35 U.S.C. 154(b) by 763 days.

(21) Appl. No.: 09/620,498

(22) Filed: Jul. 20, 2000

(30) Foreign Application Priority Data

Jul. 22, 1999 (JP) ................................. 11-207411

(51) Int. Cl.
*H04N 3/14* (2006.01)
*H04N 5/335* (2006.01)
*H01L 27/00* (2006.01)

(52) U.S. Cl. ...................... 348/308; 348/301; 348/302; 250/208.1

(58) Field of Classification Search ................ 348/302, 348/308, 250, 214, 241, 251; 250/208.1; 358/463
See application file for complete search history.

(56) References Cited

U.S. PATENT DOCUMENTS

| | | | | |
|---|---|---|---|---|
| 4,973,833 A | | 11/1990 | Takada et al. ............ 250/208.1 |
| 5,063,449 A | * | 11/1991 | Shibata et al. ............... 348/313 |
| 5,241,575 A | * | 8/1993 | Miyatake et al. ............. 377/60 |
| 5,289,286 A | * | 2/1994 | Nakamura et al. ........ 348/223.1 |
| 5,363,000 A | * | 11/1994 | Miyatake et al. ........... 327/350 |
| 5,623,306 A | * | 4/1997 | Kajihara et al. ............. 348/243 |
| 5,953,060 A | * | 9/1999 | Dierickx ..................... 348/241 |
| 6,133,862 A | * | 10/2000 | Dhuse et al. ............... 341/118 |
| 6,188,109 B1 | * | 2/2001 | Takahashi ................... 257/355 |
| 6,323,479 B1 | * | 11/2001 | Hynecek et al. ......... 250/214 L |
| 6,512,543 B1 | * | 1/2003 | Kuroda et al. .............. 348/302 |
| 2001/0045508 A1 | * | 11/2001 | Dierickx .................. 250/208.1 |

OTHER PUBLICATIONS

M. Loose et al., "Self Calibrating Logarithmis CMOS Image Sensor with Single Chip Camera Functionality", Heidelberg University Institute of High Energy Physics (IHEP), pp. 191-194.*

* cited by examiner

*Primary Examiner*—Vivek Srivastava
*Assistant Examiner*—Yogesh Aggarwal
(74) *Attorney, Agent, or Firm*—Sidley Austin LLP

(57) ABSTRACT

To reduce variations in output current of individual pixels resulting from variations in threshold voltage of the MOS transistor T1 provided in each pixel, the threshold voltage of the MOS transistor T1 of each pixel is measured to acquire compensation data with which to correct the output current from the individual pixels. To acquire this compensation data, first, a MOS transistor T2 is turned on to apply a direct-current voltage VRB to the gate of the MOS transistor T1, and the MOS transistor T3 is turned off to disconnect the gates of the MOS transistors T1 and T4 from each other. Next, in this state, by turning a signal φVPS first to a low voltage and then to a voltage close to a direct-current voltage VPD, a negative electric charge is accumulated in the MOS transistor T1. A voltage resulting from this negative electric charge is applied to the gate of the MOS transistor T4, and thus the MOS transistor T5 is turned on, causing an output current to be fed to an output signal line 6 in accordance with the voltage applied to the gate of the MOS transistor T4.

36 Claims, 15 Drawing Sheets

IMAGE-SENSING APPARATUS

This application is based on application No. H11-207411 filed in Japan on Jul. 22, 1999, the entire contents of which are hereby incorporated by reference.

BACKGROUND OF THE INVENTION

1. Field of the Invention

The present invention relates to an image-sensing apparatus, and particularly to an image-sensing apparatus incorporating a solid-state image-sensing device having a plurality of pixels arranged therein.

2. Description of the Prior Art

Solid-state image-sensing devices designed for use in image-sensing apparatuses are not only small-sized, light-weight, and power-saving, but also free from image distortion, free from image burn-in, and resistant to unfavorable environmental conditions such as vibration and electric fields. Moreover, such image-sensing devices can be manufactured by a process common or analogous to one used to manufacture LSIs (large-scale integrated circuits), and therefore they are reliable and fit for mass production. For these reasons, solid-state image-sensing devices having pixels arranged in a line are widely used in facsimile machines, flat-bed scanners, and the like, and solid-state image-sensing devices having pixels arranged in a matrix are widely used in video cameras, digital cameras, and the like. Solid-state image-sensing devices are roughly grouped into two types according to the means they use to read out (extract) the photoelectric charges generated in their photoelectric conversion devices, namely a CCD type and a MOS type. A CCD-type image-sensing device accumulates photoelectric charges in potential wells while transferring them, and has the disadvantage of a comparatively narrow dynamic range. On the other hand, a MOS-type image-sensing device reads out electric charges accumulated in the pn-junction capacitances of photodiodes through MOS transistors.

Now, how each pixel is configured in a conventional MOS-type solid-state image-sensing device will be described with reference to FIG. 21. As shown in this figure, a photodiode PD has its cathode connected to the gate of a MOS transistor T101 and to the source of a MOS transistor T102. The MOS transistor T101 has its source connected to the drain of a MOS transistor T103, and this MOS transistor T103 has its source connected to an output signal line VOUT. A direct-current voltage VPD is applied to the drain of the MOS transistor T101 and to the drain of the MOS transistor T102, and a direct-current voltage VPS is applied to the anode of the photodiode.

When light enters the photodiode PD, a photoelectric charge is generated therein, and this electric charge is accumulated at the gate of the MOS transistor T101. Here, when a pulse signal $\phi V$ is fed to the gate of the MOS transistor T103 to turn this MOS transistor T103 on, a current proportional to the electric charge accumulated at the gate of the MOS transistor T101 flows through the MOS transistors T101 and T103 to the output signal line VOUT. In this way, it is possible to read an output current that is proportional to the amount of incident light. After this signal has been read, the MOS transistor T103 is turned off and a signal $\phi RS$ is fed to the gate of the MOS transistor T102 to turn the MOS transistor T102 on so that the gate voltage of the MOS transistor T101 will be initialized.

As described above, in a conventional MOS-type solid-state image-sensing device, at each pixel, the photoelectric charge generated in the photodiode PD and then accumulated at the gate of the MOS transistor T101 is directly read out. This, however, leads to a narrow dynamic range and thus demands accurate control of the amount of exposure. Moreover, even if the amount of exposure is controlled accurately, the obtained image tends to suffer from flat blackness in dim portions thereof and saturation in bright portions thereof.

On the other hand, the assignee of the present invention has once proposed a solid-state image-sensing device including a light-sensing means that generates a photoelectric current in accordance with the amount of incident light, a MOS transistor to which the generated photoelectric current is fed, and a bias-supplying means that supplies a bias to the MOS transistor to bring it into a state in which a subthreshold current flows therethrough so that the photoelectric current is subjected to logarithmic conversion (refer to U.S. Pat. No. 5,241,575). This solid-state image-sensing device offers a wide dynamic range, but tends to suffer from different threshold-value characteristics among the MOS transistors provided in the individual pixels and thus varying sensitivity from one pixel to another. To overcome this, the outputs from the individual pixels in actual shooting of a subject need to be corrected by using compensation data that is stored beforehand by reading the outputs from the pixels with the pixels illuminated with uniformly bright light (uniform light).

However, it is troublesome for a user to illuminate the pixels with an external light source, and moreover it is difficult to illuminate them sufficiently uniformly. On the other hand, providing an image-sensing apparatus with a mechanism for illuminating uniform light complicates the structure of the image-sensing apparatus.

SUMMARY OF THE INVENTION

An object of the present invention is to provide an image-sensing apparatus that permits acquisition of compensation data for correcting the outputs from individual pixels in actual shooting of a subject without requiring illumination of the pixels with uniform light.

To achieve the above object, according to one aspect of the present invention, an image-sensing apparatus is provided with: a plurality of pixels each having a photoelectric conversion portion that has a photosensitive element for producing an electric signal in accordance with the amount of incident light and that outputs a signal obtained by converting the electric signal natural-logarithmically and a lead-out path by way of which the signal output from the photoelectric conversion portion is fed to an output signal line; and a controller that detects a variation in sensitivity of the photoelectric conversion portion of each pixel by injecting an electric charge into the photoelectric conversion portion.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Image-Sensing Apparatus

Figure 1:
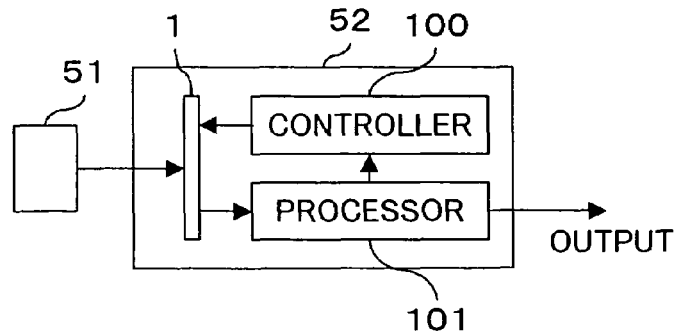
FIG. 1 is a block diagram showing the internal configuration of an image-sensing apparatus according to the invention.

First, an image-sensing apparatus according to the present invention will be described with reference to the drawings. FIG. 1 is a block diagram showing the internal configuration of an image-sensing apparatus according to the invention. The image-sensing apparatus 52 shown in FIG. 1 includes the following components. A solid-state image-sensing device 1 receives the light from a subject through an objective lens 51. A controller 100 controls the operation of the solid-state image-sensing device 1. A processor 101 checks whether the output of the solid-state image-sensing device 1 is compensation data or image data, and outputs it.

In this image-sensing apparatus 52 configured as described above, the controller 100, by switching the voltage of a signal φVPS fed to the individual pixels provided in the solid-state image-sensing device 1, switches the photoelectric conversion operation of the individual pixels between logarithmic conversion and linear conversion. Moreover, the controller 100, by feeding a pulse signal φV to the individual pixels, makes them feed the electric signals obtained as image data or compensation data as a result of photoelectric conversion to the processor 101. Moreover, after the individual pixels have output image data, the controller 100, by switching the states of signals φVPS, φSW, φV, φD, and φVRS with predetermined timing, resets the pixels and makes them output compensation data. The signals φVPS, φSW, φV, φD, and φVRS fed to the individual pixels of the solid-state image-sensing device 1 will be described later.

In this way, the solid-state image-sensing device 1 is controlled by the controller 100 by being fed with various signals as mentioned above. The output of the solid-state image-sensing device 1 is fed to the processor 101, and the processor 101 checks, on the basis of the timing with which the output is yielded, whether the output is image data or compensation data, and then outputs it to the succeeding stage. At this time, to permit the controller 100 to recognize whether the signal currently being fed to the succeeding stage is image data or compensation data, the processor 101 feeds the controller 100 with information on the signal it is currently outputting.

The above-described configuration and operation of the image-sensing apparatus are common to all of the descriptions to follow. Now, the solid-state image-sensing device provided in this image-sensing apparatus will be described.

First Example of the Pixel Configuration

Figure 2:
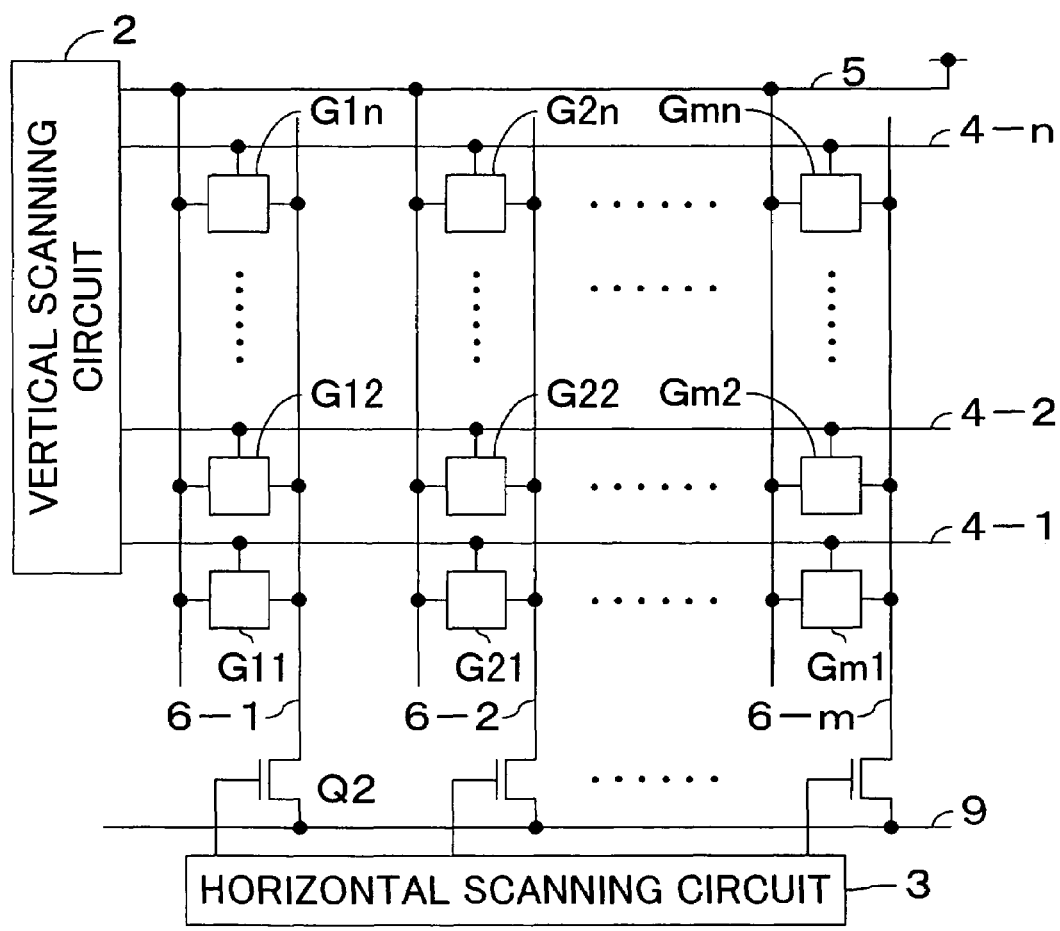
FIG. 2 is a block circuit diagram illustrating the overall configuration of a two-dimensional solid-state image-sensing device embodying the invention.
Figure 3:
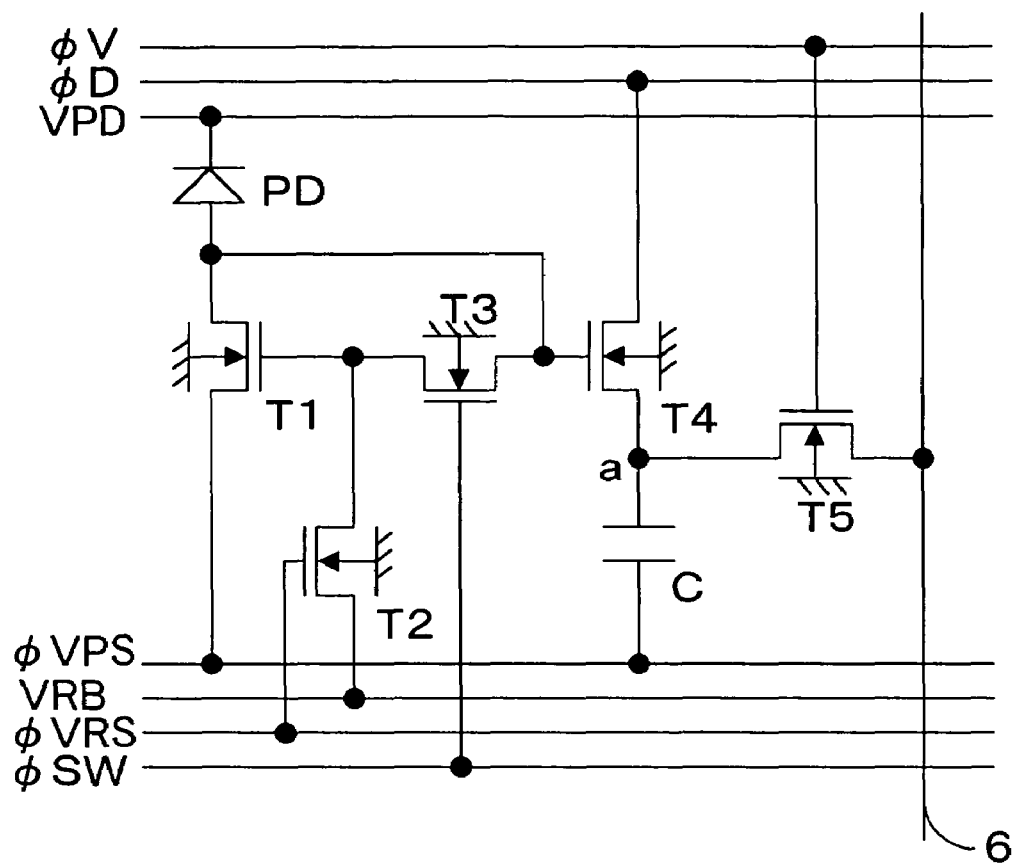
FIG. 3 is a circuit diagram showing the configuration of each pixel in a first embodiment of the invention.

Hereinafter, embodiments of the solid-state image-sensing device 1 provided in the image-sensing apparatus shown in FIG. 1 will be described with reference to the drawings. FIG. 2 schematically shows the configuration of part of a two-dimensional MOS-type solid-state image-sensing device employed in an image-sensing apparatus embodying the invention. In this figure, reference symbols G11 to Gmn represent pixels that are arranged in a two-dimensional array (in a matrix). Reference numeral 2 represents a vertical scanning circuit, which scans lines (rows) 4-1, 4-2, . . . , 4-n sequentially. Reference numeral 3 represents a horizontal scanning circuit, which reads out, sequentially pixel by pixel in a horizontal direction, the signals fed from the individual pixels to output signal lines 6-1, 6-2, . . . , 6-m as a result of photoelectric conversion performed in those pixels. Reference numeral 5 represents a power line. The individual pixels are connected not only to the lines 4-1, 4-2, . . . , 4-n, to the output signal lines 6-1, 6-2, . . . , 6-m, and to the power line 5 mentioned above, but also to other lines (for example clock lines and bias supply lines). These other lines, however, are omitted in FIG. 2, and are shown in FIG. 3, which shows a first embodiment of the invention.

As shown in FIG. 2, for each of the output signal lines 6-1, 6-2, . . . , 6-m, one N-channel MOS transistor Q2 is provided. Here, a description will be given only with respect to the output signal line 6-1 as their representative. The MOS transistor Q2 has its drain connected to the output signal line 6-1, has its source connected to a signal line 9 serving as a final destination line, and has its gate connected to the horizontal scanning circuit 3. As will be described later, within each pixel, another N-channel MOS transistor (a fifth MOS transistor) T5 functioning as a switch is provided.

Whereas this MOS transistor T5 serves to select a row, the MOS transistor Q2 serves to select a column.

First Embodiment

Now, a first embodiment of the invention, which is applicable to each pixel of the first example of the pixel configuration shown in FIG. 2, will be described with reference to the drawings.

In FIG. 3, a pn photodiode PD serves as a photosensitive element (photoelectric conversion element). The anode of this photodiode PD is connected to the drain of a first MOS transistor T1, also to the drain of a third MOS transistor T3, and also to the gate of a fourth MOS transistor T4. The source of the MOS transistor T4 is connected to the drain of a fifth MOS transistor T5 for selecting a row. The source of this MOS transistor T5 is connected to the output signal line 6 (this output signal line 6 corresponds to the output signal lines 6-1, 6-2, . . . , 6-m in FIG. 2). The MOS transistors T1 to T5 are all N-channel MOS transistors, and have their back gates grounded.

A direct-current voltage VPD is applied to the cathode of the photodiode PD. On the other hand, a signal φVPS is applied to the source of the MOS transistor T1, and also to one end of a capacitor C of which the other end is connected to the source of the MOS transistor T4. A direct-current voltage VRB is applied to the source of the MOS transistor T2, and a signal φVRS is fed to the gate of the same MOS transistor T2. The drain of this MOS transistor T2 is connected to the gate of the MOS transistor T1 and also to the source of the MOS transistor T3. A signal φD is fed to the drain of the MOS transistor T4. Moreover, a signal φSW is fed to the gate of the MOS transistor T3. Furthermore, a signal φV is fed to the gate of the MOS transistor T5. It is to be noted that, in this embodiment, the signal φVPS is a binary signal that takes one of two predetermined levels, i.e. either a low level or a high level, at a time. Here, a low level refers to a level that causes the MOS transistor T1 to operate in a subthreshold region, and a high level is a level that is approximately equal to the direct-current voltage VPD.

Figure 4A:
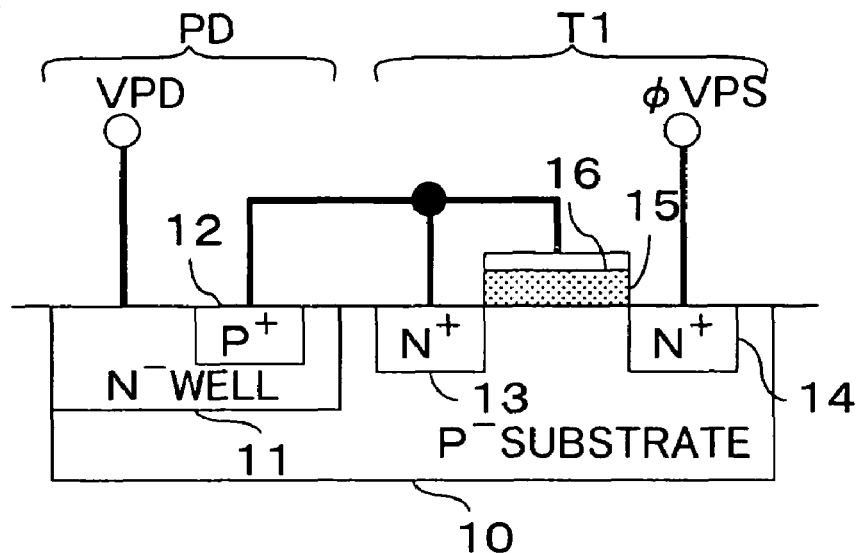
FIGS. 4A, 4B, and 4C are diagrams showing the structure of and the potential relationship observed in a pixel according to the invention.
Figure 4B:
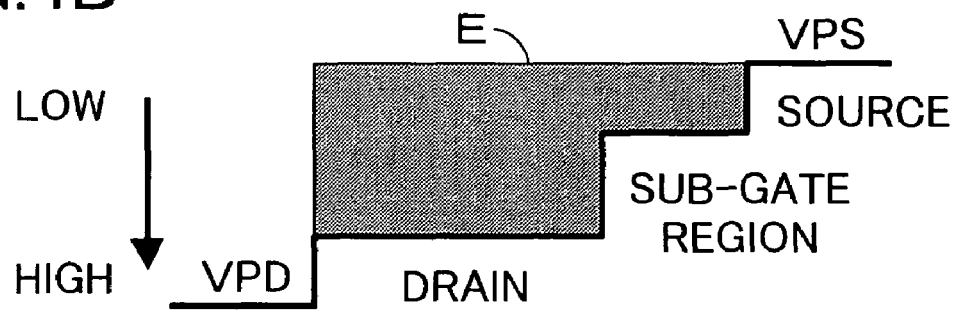
Figure 4C:
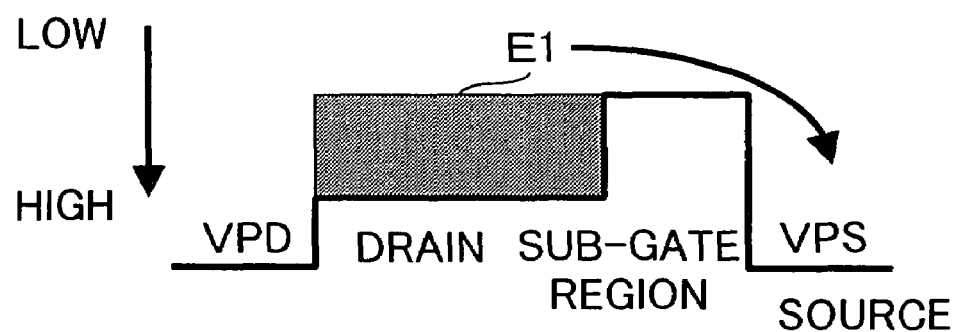

In this pixel having a circuit configuration as described above, to permit the MOS transistor T1 to operate in a subthreshold region, it is necessary to know the threshold value TH at the gate of the MOS transistor T1. Now, the method of detecting this threshold value TH (i.e. the method of detecting variations in sensitivity of the individual pixels) will be described with reference to FIGS. 3, 4A, 4B, and 4C. FIG. 4A is a diagram showing the structure of the photodiode PD and the MOS transistor T1. FIGS. 4B and 4C are diagrams showing the potential relationship in the photodiode PD and the MOS transistor T1. In the potential diagrams of FIGS. 4B and 4C, the arrow at the left indicates the direction in which the potential increases.

Incidentally, as shown in FIG. 4A, the photodiode PD is formed, for example, by forming an N-type well layer 11 in a P-type semiconductor substrate (hereinafter referred to as the "P-type substrate") 10 and then forming, in this N-type well layer 11, a P-type diffusion layer 12. On the other hand, the MOS transistor T1 is formed by forming N-type diffusion layers 13 and 14 in the P-type substrate 10 and then forming, on top of the channel left between those N-type diffusion layers 13 and 14, an oxide film 15 and, further on top thereof, a polysilicon layer 16. Here, the N-type well layer 11 functions as the cathode of the photodiode PD, and the P-type diffusion layer 12 functions as the anode thereof. On the other hand, the N-type diffusion layers 13 and 14 function as the drain and the source, respectively, of the MOS transistor T1, and the oxide film 15 and the polysilicon layer 16 function as the gate insulating film and the gate electrode, respectively, thereof. Here, in the P-type substrate 10, the region between the N-type diffusion layers 13 and 14 is called the sub-gate region.

(1) How to Detect Variations in Sensitivity of the Individual Pixels

First, the voltage of the signal φSW is turned to a low level to turn off the MOS transistor T3, and the voltage of the signal φVRS is turned to a high level to turn on the MOS transistor T2. Moreover, the signal φV is turned to a low level to turn off the transistor T5. In this way, the gate of the MOS transistor T1 is disconnected from the gate of the MOS transistor T4, and the direct-current voltage VRB is applied to the gate of the MOS transistor T1. Furthermore, the voltage of the signal φD is turned to a high level (a potential equal to or close to the direct-current voltage VPD). In this embodiment, the threshold value of a transistor is detected by injecting an electric charge into it, and therefore, in detecting variations in sensitivity of the individual pixels, there is no need to illuminate the photodiodes used as photosensitive elements with light prepared specially to expose them to uniform light or the like. This applies to all of the embodiments described hereafter.

Next, the voltage of the signal φVPS fed to the source of the MOS transistor T1 is lowered. Lowering the voltage of the signal φVPS brings the drain, sub-gate region, and source of the MOS transistor T1 into a potential relationship as shown in FIG. 4B, causing the source, sub-gate region, and drain to have increasingly high potentials in this order. Accordingly, a negative electric charge flows into the MOS transistor T1 via the source thereof. At this time, the duration for which the electric charge is accumulated is very short, and therefore the MOS transistor T1 receives practically no positive electric charge via its drain. As a result, the negative electric charge is accumulated between the drain and source of the MOS transistor T1.

Next, by turning the voltage of the signal φVPS to a potential equal to or close to the direct-current voltage VPD, as shown in FIG. 4C, the potential at the source of the MOS transistor T1 is made higher than the potential at the sub-gate region thereof. As a result, the negative electric charge accumulated between the drain and source of the MOS transistor T1 flows out to the signal line of the signal φVPS. However, still the potential at the drain of the MOS transistor T1 is higher than the potential at the sub-gate region thereof, and therefore part E1 of the negative electric charge accumulated at the drain of the MOS transistor T1 remains at the drain of the MOS transistor T1. If it is assumed that the gate voltage is VG and that the threshold voltage is VTH, then the potential at the sub-gate region of the MOS transistor T1 is proportional to (VG−VTH). Hence, considering that the direct-current voltage VRB applied to the gate of the MOS transistor T1 is constant, the amount of negative electric charge that remains at the drain thereof is proportional to (VRB−VTH).

Figure 20:
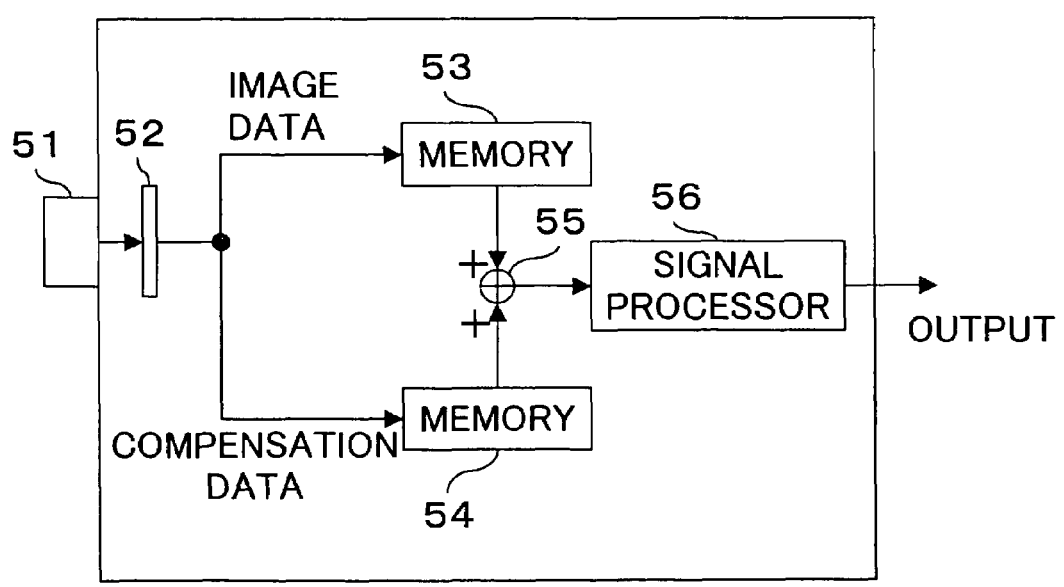
FIG. 20 is a block diagram showing the internal configuration of an image input apparatus provided with an image-sensing apparatus having pixels configured according to one of the embodiments of the invention.
Figure 21:
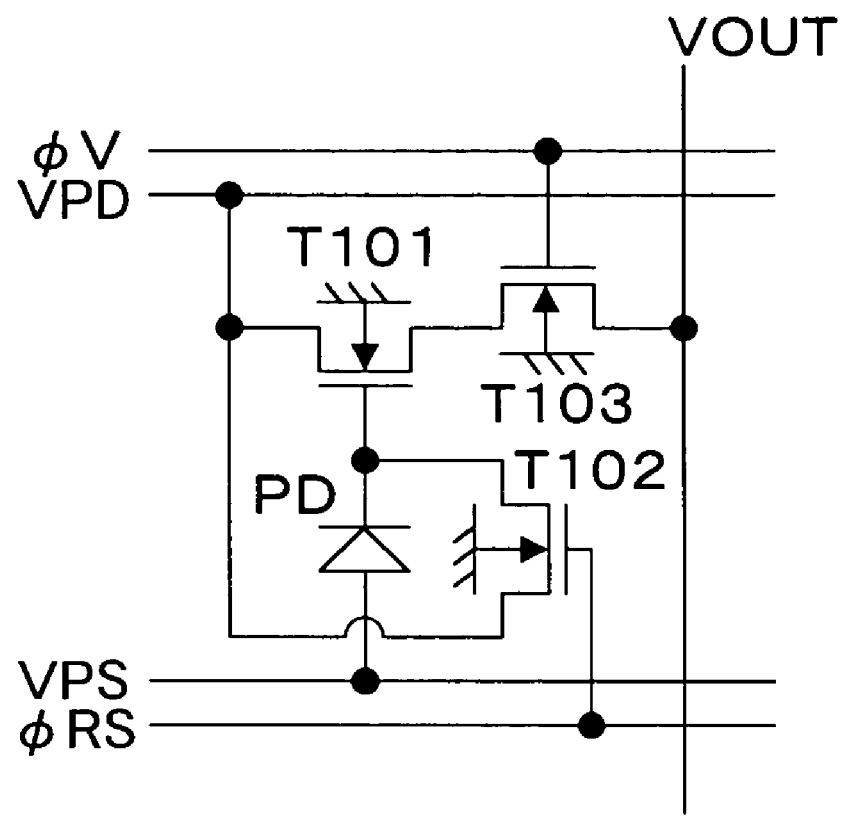
FIG. 21 is a circuit diagram showing the configuration of each pixel in a conventional solid-state image-sensing device.

In this way, the drain voltage of the MOS transistor T1 is proportional to the threshold voltage VTH, and this drain voltage of the MOS transistor T1 appears at the gate of the MOS transistor T4. Thus, the voltage appearing at the gate of the MOS transistor T4 is proportional to the amount of negative electric charge accumulated at the drain of the MOS transistor T1, and is therefore proportional to the threshold voltage VTH. This gate voltage of the MOS transistor T4 causes a current to flow through the MOS transistor T4, thereby causes an electric charge to be accumulated in the capacitor C, and thereby causes the potential at the node "a" to rise. Thus, by turning the signal φV to a high level and thereby turning on the MOS transistor T5, the electric charge accumulated in the capacitor C is fed, as an output current, to the output signal line 6. In this way, a current proportional to the threshold voltage VTH of the MOS transistor T1 of one pixel after another is fed to the output signal line 6, and is acquired as compensation data to be used to correct the outputs from the individual pixels. More specifically, this current proportional to the threshold voltage VTH is fed out serially, from one pixel after another, by way of the signal line 9 so that the succeeding circuit stores it in a memory as compensation data for the individual pixels. Thus, during actual image sensing, by correcting pixel by pixel the output current from the pixels with the compensation data stored beforehand as described above, it is possible to eliminate from the output signal the components resulting from variations in sensitivity of the individual pixels. A practical example of how this compensation is achieved is shown in FIG. 20 and will be described later.

After the acquisition of compensation data as described above, the MOS transistor T5 is turned off, and the signal φD is turned to a low level so that, through the MOS transistor T4, the electric charge accumulated in the capacitor C is discharged therefrom to the signal line of the signal φD, and thereby the capacitor C, and thus the potential at the node "a", is initialized. Subsequently, the MOS transistor T3 is turned on so that, through the MOS transistors T2 and T3, the electric charges accumulated in the photodiode PD, at the drain of the MOS transistor T1, and at the gate of the MOS transistor T4 are discharged and thereby those elements are initialized.

The detection of variations in sensitivity itself takes only a very short time, and therefore, in the process described above, the photodiode does not necessarily have to be prevented from exposure to light during the detection of variations. However, it is preferable that the photodiode be prevented at least from exposure to light so intense as to affect the detection of variations in threshold values. Although it is preferable to keep the photodiode in a dark state, it suffices to keep the photodiode in ambient light as long as there is no risk of exposure to extremely intense light. This prevents the photodiode from generating an unnecessary electric signal, and thereby makes it possible to detect variations more accurately. This applies to all of the embodiments described hereafter.

(2) How to Convert the Light Incident on the Individual Pixels into an Electric Signal In this embodiment, by switching the voltage of the signal φVPS and thereby switching the bias to the MOS transistor T1, it is possible to switch between two modes of conversion so as to allow the output signal fed from each pixel to the output signal line 6 to vary either natural-logarithmically or linearly with respect to the electric signal (hereafter referred to as the "photoelectric current") that the photodiode PD outputs in accordance with the amount of incident light. Here, the signal φSW is kept at a high level to keep the MOS transistor T3 on so that the MOS transistors T1 and T4 are kept in a state equivalent to when their gates are connected together. The two modes mentioned above will be described individually below.

Figure 5A:
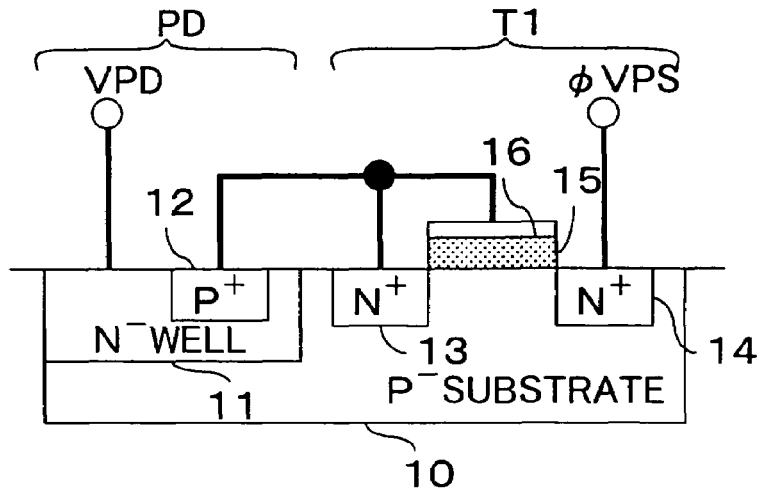
FIGS. 5A, 5B, and 5C are diagrams showing the potential relationship observed in a pixel according to the invention.
Figure 5B:
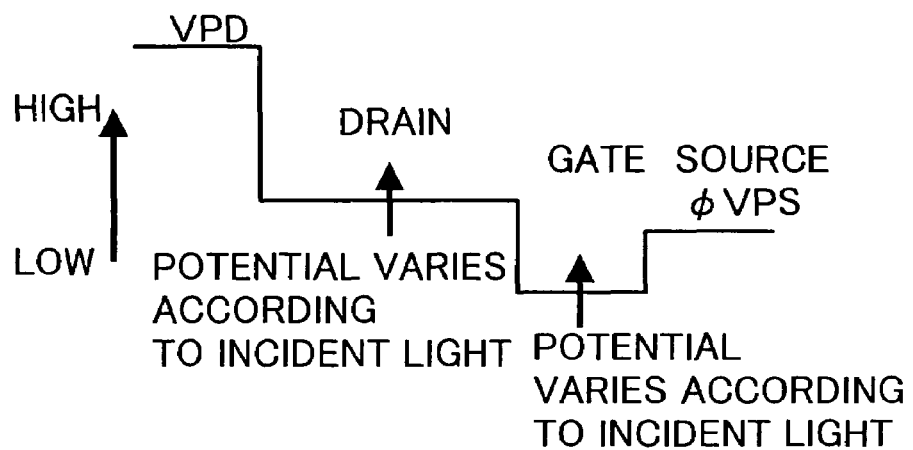
Figure 5C:
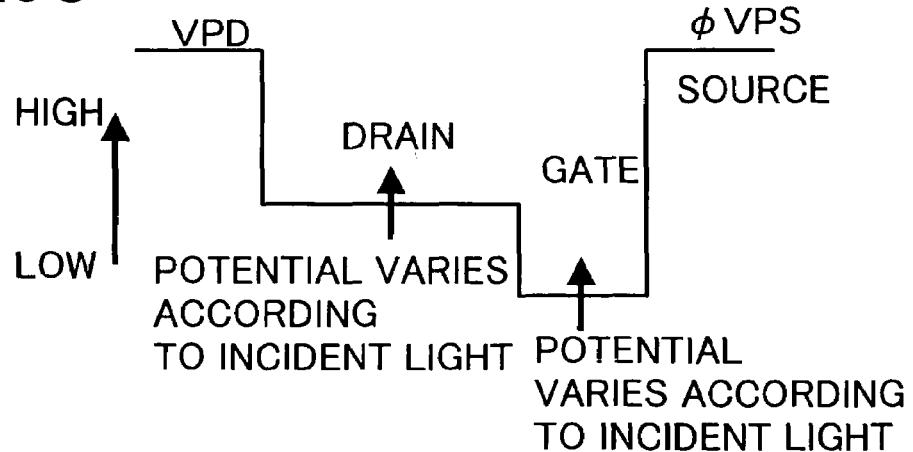

(2-1) Mode in Which the Photoelectric Current is Output after being Converted Natural-Logarithmically First, with reference to FIGS. 3, 5A, and 5B, a description will be given of how conversion is achieved when the signal φVPS is kept at a low level to permit the MOS transistors T1 and T4 to operate in a subthreshold region. In this mode, where the signal φVRS fed to the gate of the MOS transistor T2 is kept at a low level, the MOS transistor T2 remains off, and can thus be ignored as practically absent. In FIGS. 5B and 5C, the arrow at the left indicates the direction in which the potential increases.

When the signal φVPS is at a low level, the photodiode PD and the MOS transistor T1 has potentials as shown in FIG. 5B. In the circuit shown in FIG. 3, when light enters the photodiode PD, a photoelectric current is generated therein, and, due to the subthreshold characteristics of MOS transistors, a voltage having the value obtained by converting the photoelectric current natural-logarithmically appears at the gates of the MOS transistors T1 and T4. This voltage causes a current to flow through the MOS transistor T4, and, as a result, an electric charge that is equivalent to the value obtained by converting the integral of the photoelectric current natural-logarithmically is accumulated in the capacitor C. That is, a voltage proportional to the value obtained by converting the integral of the photoelectric current natural-logarithmically appears at the node "a" between the capacitor C and the source of the MOS transistor T4. Here, the MOS transistor T5 remains off.

Next, the pulse signal φV is fed to the gate of the MOS transistor T5 to turn this MOS transistor T5 on. This causes the electric charge accumulated in the capacitor C to be fed as the output current to the output signal line 6. This current thus fed to the output signal line 6 has the value obtained by converting the integral of the photoelectric current natural-logarithmically. In this way, it is possible to read a signal (output current) that is proportional to the logarithm of the amount of incident light. After this signal has been read, the MOS transistor T5 is turned off. Thereafter, the signal φD is turned to a low level, so that the electric charge accumulated in the capacitor C is discharged through the MOS transistor T4 to the signal line of the signal φD, and thereby the potential at the capacitor C, and thus at the node "a", is initialized. By repeating this sequence of operations at regular time intervals, it is possible to shoot continuously an ever-changing subject image with a wide dynamic range. It is to be noted that, when the output current is so controlled as to vary natural-logarithmically with respect to the amount of incident light as in this mode, the signal φVRS is kept at a low level all the time.

(2-2) Mode in which the Photoelectric Current is Output after being Converted Linearly Next, a description will be given of how conversion is achieved when the signal φVPS is kept at a high level. In this mode, the photodiode PD and the MOS transistor T1 have potentials as shown in FIG. 5C. Accordingly, the MOS transistor T1 is kept practically off, and thus no current flows through the channel between the source and the drain thereof. Moreover, the signal φVRS fed to the gate of the MOS transistor T2 is kept at a low level, and thus this MOS transistor T2 is kept off.

First, the MOS transistor T5 is turned off, and the signal φD is turned to a low level (to a potential lower than the signal φVPS), so that the electric charge in the capacitor C flows through the MOS transistor T4 to the signal line of the signal φD, and thereby the capacitor C is reset. As a result, the potential at the node "a" is initialized, for example, to a potential lower than the direct-current voltage VPD. This potential is maintained by the capacitor C. Thereafter, the signal φD is turned back to a high level (to a potential equal to or close to the direct-current voltage VPD). In this state, when light enters the photodiode PD, a photoelectric current is generated therein. At this time, since capacitors exist between the back gate and gate of the MOS transistor T1 and at the junction of the photodiode PD, the electric charge resulting from the photoelectric current is accumulated mainly at the gates of the MOS transistors T1 and T4. Thus, the gate voltage of the MOS transistors T1 and T4 has the value proportional to the integral of the photoelectric current.

Now that the potential at the node "a" is lower than the direct-current voltage VPD, the MOS transistor T4 is on. As a result, a current corresponding to the gate voltage of the MOS transistor T4 flows through the MOS transistor T4 as its drain current, and thus an electric charge proportional to the gate voltage of the MOS transistor T4 is accumulated in the capacitor C. Accordingly, the voltage at the node "a" has the value proportional to the integral of the photoelectric current. Next, the pulse signal φV is fed to the gate of the MOS transistor T5 to turn this MOS transistor T5 on, so that the electric charge accumulated in the capacitor C is fed as the output current to the output signal line 6. This output current has the value obtained by converting the integral of the photoelectric current linearly.

In this way, it is possible to read a signal (output current) that is proportional to the amount of incident light. Thereafter, the MOS transistor T5 is turned off, and the signal φD is turned to a low level, so that the electric charge accumulated in the capacitor C is discharged through the MOS transistor T4 to the signal line of the signal φD, and thereby the potential at the capacitor C, and thus at the node "a", is initialized. Thereafter, a high level is fed as the signal φVRS to the gate of the MOS transistor T2 to turn this MOS transistor T2 on so as to initialize the photodiode PD, the drain voltage of the MOS transistor T1, and the gate voltage of the MOS transistors T1 and T4. By repeating this sequence of operations at regular time intervals, it is possible to shoot continuously an ever-changing subject image with a satisfactory S/N ratio.

As described above, in this embodiment, simple manipulation of potentials makes it possible to switch the output characteristics of a single pixel among a plurality of patterns of output characteristics. When the conversion mode is switched from logarithmic conversion to linear conversion, it is preferable to switch the output first by adjusting the potential of the signal φVPS and then make the MOS transistor T2 reset the MOS transistor T1 and others. On the other hand, when the conversion mode is switched from linear conversion to logarithmic conversion, it is not necessary to make the MOS transistor T2 reset the MOS transistor T1 and others. This is because the carriers accumulated in the MOS transistor T1 as a result of the MOS transistor T1 not really being kept in a completely off state are canceled by carriers of the opposite polarity.

The reading of the signal from each pixel may be achieved by means of a CCD (charge-coupled device). In that case, the transfer of an electric charge to the CCD is achieved by providing a potential barrier with a variable potential that corresponds to the MOS transistor T5 shown in FIG. 2.

Second Example of the Pixel Configuration

Figure 6:
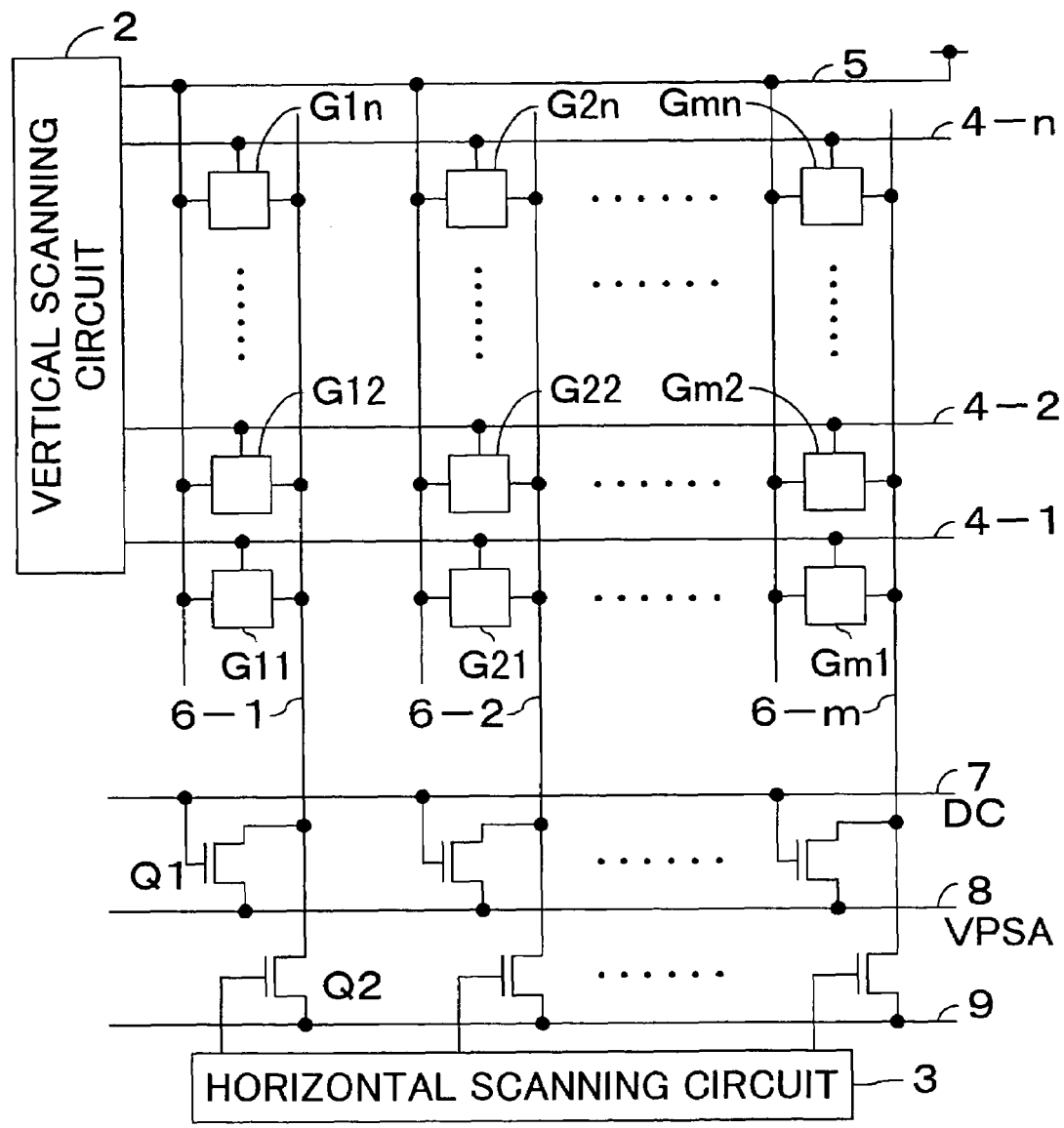
FIG. 6 is a block circuit diagram illustrating the overall configuration of another two-dimensional solid-state image-sensing device embodying the invention.

FIG. 6 schematically shows the configuration of part of another two-dimensional MOS-type solid-state image-sensing device employed in an image-sensing apparatus embodying the invention. In this figure, reference symbols G11 to Gmn represent pixels that are arranged in a two-dimensional array (in a matrix). Reference numeral 2 represents a vertical scanning circuit, which scans lines (rows) 4-1, 4-2, . . . , 4-n sequentially. Reference numeral 3 represents a horizontal scanning circuit, which reads out, sequentially pixel by pixel in a horizontal direction, the signals fed from the individual pixels to output signal lines 6-1, 6-2, . . . , 6-m as a result of photoelectric conversion performed in those pixels. Reference numeral 5 represents a power line. The individual pixels are connected not only to the lines 4-1, 4-2, . . . , 4-n, to the output signal lines 6-1, 6-2, . . . , 6-m, and to the power line 5 mentioned above, but also to other lines (for example clock lines and bias supply lines). These other lines, however, are omitted in FIG. 6, and are shown in individual embodiments of the invention shown in FIG. 8 and the following figures.

As shown in FIG. 6, for each of the output signal lines 6-1, 6-2, . . . , 6-m, a pair of N-channel MOS transistors Q1 and Q2 is provided. Here, a description will be given only with respect to the output signal line 6-1 as their representative. The MOS transistor Q1 has its gate connected to a direct-current voltage line 7, has its drain connected to the output signal line 6-1, and has its source connected to a direct-current voltage VPSA line 8. On the other hand, the MOS transistor Q2 has its drain connected to the output signal line 6-1, has its source connected to a signal line 9 serving as a final destination line, and has its gate connected to the horizontal scanning circuit 3.

Figure 7A:
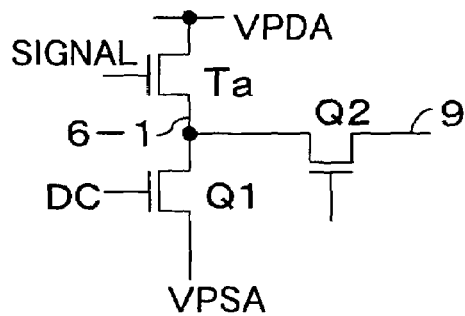
FIGS. 7A and 7B are circuit diagrams of a portion of the circuit shown in FIG. 6.

As will be described later, the pixels G11 to Gmn are each provided with an N-channel MOS transistor Ta that outputs a signal in accordance with the photoelectric charge generated in each pixel. How this MOS transistor Ta is connected to the above-mentioned MOS transistor Q1 is shown in FIG. 7A. This MOS transistor Ta corresponds to a sixth MOS transistor T6 in the second and third embodiments, and corresponds to a fourth MOS transistor T4 in the fourth and fifth embodiments. Here, the direct-current voltage VPSA connected to the source of the MOS transistor Q1 and the direct-current voltage VPDA connected to the drain of the MOS transistor Ta fulfill the relation VPDA>VPSA, where the direct-current voltage VPSA is equal to, for example, the ground-level voltage. In this circuit configuration, the signal from a pixel is fed to the gate of the upper-stage MOS transistor Ta, and a direct-current voltage DC is kept applied to the gate of the lower-stage MOS transistor Q1. Thus, the lower-stage MOS transistor Q1 is equivalent to a resistor or constant-current source, and therefore the circuit shown in FIG. 7A forms an amplifier circuit of a source-follower type. Here, it can safely be assumed that, as a result of amplification, the MOS transistor Ta outputs a current.

Figure 7B:
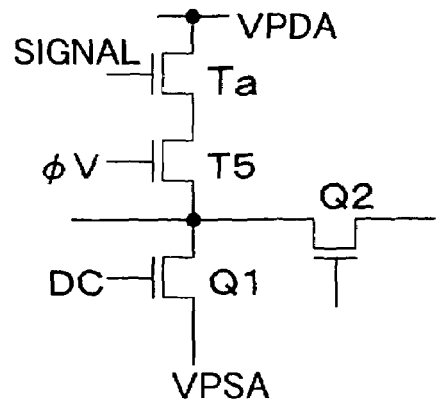

The MOS transistor Q2 is controlled by the horizontal scanning circuit 3 so as to function as a switching device. As will be described later, in all of the embodiments of the invention shown in FIG. 8 and the following figures, within each pixel, another, i.e. a fifth, N-channel MOS transistor T5 functioning as a switch is provided. If this fifth MOS transistor T5 is illustrated explicitly, the circuit shown in FIG. 7A has, more precisely, a circuit configuration as shown in FIG. 7B. Specifically, the MOS transistor T5 is inserted between the MOS transistor Q1 and the MOS transistor Ta. Here, the MOS transistor T5 serves to select a row, and the MOS transistor Q2 serves to select a column. It is to be noted that the circuit configurations shown in FIGS. 6, 7A, and 7B are common to the second to fifth embodiments of the invention described hereafter.

The circuit configuration shown in FIGS. 7A and 7B permits the signal to be output with a high gain. Accordingly, even in a case where the photoelectric current generated in a photosensitive element is converted natural-logarithmically to obtain a wider dynamic range and thus the output signal obtained is comparatively low, this amplifier circuit amplifies the signal so as to make it sufficiently high and thus easier to process in the succeeding signal processing circuit (not shown). Here, the MOS transistor Q1 that serves as the load resistor of the amplifier circuit is provided within each pixel; however, such transistors may be provided, instead, one for each of the output signal lines 6-1, 6-2, . . . , 6-m, i.e. one for each of the groups of pixels that individually constitute columns, with the pixels constituting each column collectively connected to one of the output signal lines 6-1, 6-2, . . . , 6-m. This helps reduce the number of load resistors or constant-current sources required, and thus reduce the area occupied by the amplifying circuits on a semiconductor chip.

Second Embodiment

Figure 8:
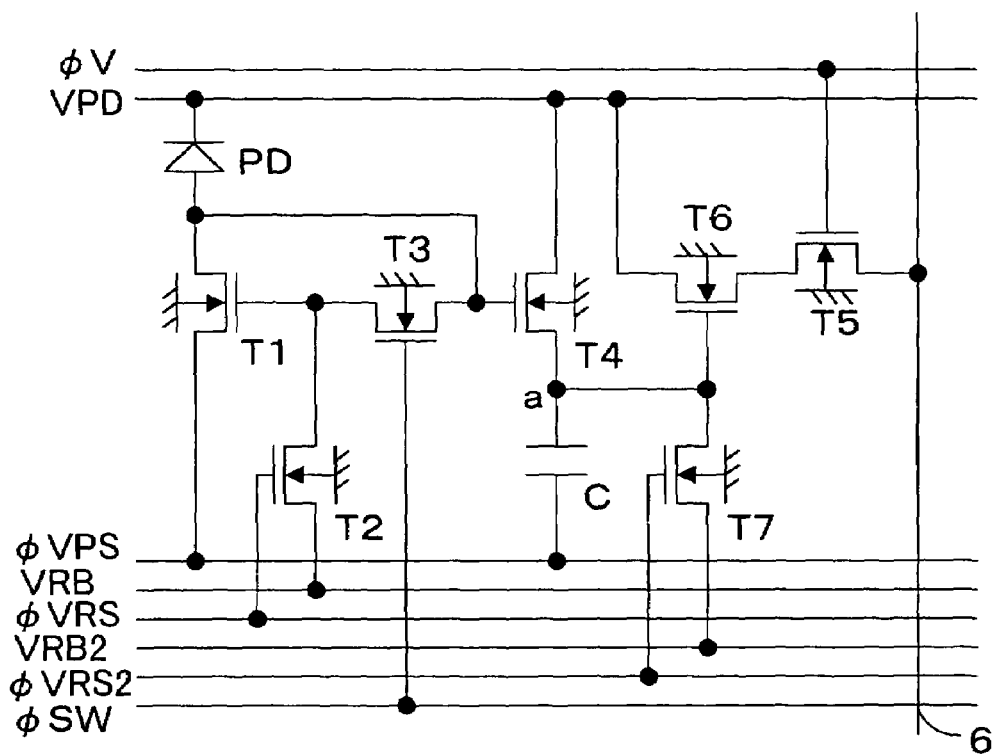
FIG. 8 is a circuit diagram showing the configuration of each pixel in a second embodiment of the invention.

Next, a second embodiment of the invention, which is applicable to each pixel of the second example of the pixel configuration shown in FIG. 6, will be described with reference to the drawings. FIG. 8 is a circuit diagram showing the configuration of each pixel of the solid-state image-sensing device of this embodiment. It is to be noted that such elements, signal lines, and others as are used for the same purposes here as in the pixel shown in FIG. 2 are identified with the same reference symbols, and their detailed descriptions will be omitted.

As shown in FIG. 8, in this embodiment, as compared with the pixel shown in FIG. 2, there are provided additionally a sixth MOS transistor T6 having its gate connected to the node "a" for performing current amplification in accordance with the voltage at the node "a", a fifth MOS transistor T5 having its drain connected to the source of the MOS transistor T6 for row selection, a seventh MOS transistor T7 having its drain connected to the node "a" for initializing the potential at the capacitor C, and thus at the node "a". The source of the MOS transistor T5 is connected to the output signal line 6 (this output signal line 6 corresponds to the output signal lines 6-1, 6-2, . . . 6-m shown in FIG. 6). Just like the MOS transistors T1 to T5, the MOS transistors T6 and T7 are all N-channel MOS transistors, and have their back gates grounded.

A direct-current voltage VPD is applied to the drain of the MOS transistor T6, and a signal φV is fed to the gate of the MOS transistor T5. A direct-current voltage VRB2 is applied to the source of the MOS transistor T7, and a signal φVRS2 is fed to the gate of the same MOS transistor T7. The direct-current voltage VPD is applied also to the drain of the MOS transistor T4. In this embodiment, it is possible to make the MOS transistors T1 to T5 and the capacitor C to operate in the same manner as in the first embodiment (FIG. 3) so as to output a current that permits the detection of variations in sensitivity of the individual pixels. Now, how this is achieved will be described.

(1) How to Detect Variations in Sensitivity of the Individual Pixels

First, the MOS transistor T5 is turned off, and the MOS transistor T3 is turned off to bring the MOS transistors T1 and T4 into a state equivalent to when their gates are disconnected from each other. In addition, the MOS transistor T2 is turned on to apply the direct-current voltage VRB to the gate of the MOS transistor T1. Furthermore, the voltage of the signal φVRS2 is turned to a low level to turn off the MOS transistor T7. With the individual pixels brought into this state, the voltage of the signal φVPS applied to the source of the MOS transistor T1 is turned first to a low level and then back to a high level as in the first embodiment (FIGS. 4B and 4C). This causes a negative electric charge to be accumulated at the drain of the MOS transistor T1, and, in accordance with the drain voltage thereof that varies with this negative electric charge, a current flows through the MOS transistor T4.

This current flowing through the MOS transistor T4 causes an electric charge to be accumulated in the capacitor C, and thereby causes the potential at the node "a" to rise. Next, the signal φV is turned to a high level to turn on the MOS transistor T5. This causes a current to flow through the MOS transistor T6 in accordance with the voltage appearing at the node "a", and this current is fed, as the output current, to the output signal line 6. The output current thus fed to the output signal line 6 is proportional to the threshold voltage VTH of the MOS transistor T1, and therefore, on the basis of this output current, it is possible to acquire compensation data to be used to correct the outputs from the individual pixels. Moreover, as in the first embodiment (FIG. 3), this current proportional to the threshold voltage VTH is fed out serially, from one pixel after another, by way of the signal line 9 shown in FIG. 6 so that the succeeding circuit stores it in a memory as compensation data for the individual pixels. Thus, during actual image sensing, by using the compensation data thus stored, it is possible to eliminate from the output signal the components resulting from variations in sensitivity of the individual pixels. A practical example of how this compensation is achieved is shown in FIG. 20 and will be described later.

After the acquisition of compensation data as described above, the MOS transistor T5 is turned off, and a high level is fed as the signal φVRS2 to the gate of the MOS transistor T7 so that the MOS transistor T7 is turned on and thereby the capacitor C, and thus the potential at the node "a", is initialized. Subsequently, the MOS transistor T3 is turned on so that, through the MOS transistors T2 and T3, the electric charges accumulated in the photodiode PD, at the drain of the MOS transistor T1, and at the gate of the MOS transistor T4 are discharged and thereby those elements are initialized.

(2) How to Convert the Light Incident on the Individual Pixels into an Electric Signal In this embodiment, by switching the voltage of the signal φVPS and thereby switching the bias to the MOS transistor T1, it is possible, as in the first embodiment, to switch between two modes of conversion so as to allow the output signal fed from each pixel to the output signal line 6 to vary either natural-logarithmically or linearly with respect to the photoelectric current that the photodiode PD outputs in accordance with the amount of incident light. Here, the signal φSW is kept at a high level to keep the MOS transistor T3 on so that the MOS transistors T1 and T4 are kept in a state equivalent to when their gates are connected together. The two modes mentioned above will be described individually below.

(2-1) Mode in which the Photoelectric Current is Output after being Converted Natural-Logarithmically First, a description will be given of how conversion is achieved when the signal φVPS is kept at a low level to permit the MOS transistors T1 and T4 to operate in a subthreshold region. As in the first embodiment, in this mode, where the signal φVRS fed to the gate of the MOS transistor T2 is kept at a low level, the MOS transistor T2 remains off, and can thus be ignored as practically absent.

When light enters the photodiode PD, a photoelectric current is generated therein, and, due to the subthreshold characteristics of MOS transistors, a voltage having the value obtained by converting the photoelectric current natural-logarithmically appears at the gates of the MOS transistors T1 and T4. This voltage causes a current to flow through the MOS transistor T4, and, as a result, an electric charge that is equivalent to the value obtained by converting the integral of the photoelectric current natural-logarithmically is accumulated in the capacitor C. That is, a voltage proportional to the value obtained by converting the integral of the photoelectric current natural-logarithmically appears at the node "a" between the capacitor C and the source of the MOS transistor T4. Here, the MOS transistors T5 and T7 remain off.

Next, the pulse signal φV is fed to the gate of the MOS transistor T5 to turn this MOS transistor T5 on. This causes a current proportional to the voltage applied to the gate of the MOS transistor T6 to flow through the MOS transistors T5 and T6 to the output signal line 6. Now, the voltage applied to the gate of the MOS transistor T6 is equal to the voltage applied to the node "a", and therefore the current thus fed to the output signal line 6 has the value obtained by converting the integral of the photoelectric current natural-logarithmically.

In this way, it is possible to read a signal (output current) that is proportional to the logarithm of the amount of incident light. After this signal has been read, the MOS transistor T5 is turned off, and a high level is fed as the signal φVRS2 to the gate of the MOS transistor T7, so that the MOS transistor T7 is turned on, and thereby the potential at the capacitor C, and thus at the node "a", is initialized. It is to be noted that, when the output current is so controlled as to vary natural-logarithmically with respect to the amount of incident light as in this mode, the signal φVRS is kept at a low level all the time.

(2-2) Mode in which the Photoelectric Current is Output after being Converted Linearly Next, a description will be given of how conversion is achieved when the signal φVPS is kept at a high level. First, a low level is fed as the signal φVRS to the gate of the MOS transistor T2 to turn this MOS transistor T2 practically off. In addition, a high level is fed as the signal φVRS2 to the gate of the MOS transistor T7 to turn this MOS transistor T7 on and thereby reset the capacitor C, and simultaneously the potential at the node "a" is initialized to the potential VRB2, which is lower than the direct-current voltage VPD. This potential is maintained by the capacitor C. Thereafter, the signal φVRS2 is turned to a low level to turn the MOS transistor T7 off. In this state, when light enters the photodiode PD, a photoelectric current is generated therein. At this time, since capacitors exist between the back gate and gate of the MOS transistor T1 and at the junction of the photodiode PD, the electric charge resulting from the photoelectric current is accumulated mainly at the gates of the MOS transistors T1 and T4. Thus, the gate voltage of the MOS transistors T1 and T4 has the value proportional to the integral of the photoelectric current.

Now that the potential at the node "a" is lower than the direct-current voltage VPD, the MOS transistor T4 is on. As a result, a current corresponding to the gate voltage of the MOS transistor T4 flows through the MOS transistor T4 as its drain current, and thus an electric charge proportional to the gate voltage of the MOS transistor T4 is accumulated in the capacitor C. Accordingly, the voltage at the node "a" has the value proportional to the integral of the photoelectric current. Next, the pulse signal φV is fed to the gate of the MOS transistor T5 to turn this MOS transistor T5 on, so that a current proportional to the voltage applied to the gate of the MOS transistor T6 flows through the MOS transistors T5 and T6 to the output signal line 6. Since the voltage applied to the gate of the MOS transistor T6 is equal to the voltage at the node "a", the current thus fed to the output signal line 6 has the value obtained by converting the integral of the photoelectric current linearly.

In this way, it is possible to read a signal (output current) that is proportional to the amount of incident light. After this signal has been read, the MOS transistor T5 is turned off, and a high level is fed as the signal φVRS to the gate of the MOS transistor T2 to turn this MOS transistor T2 on so as to initialize the photodiode PD, the drain of the MOS transistor T1, and the gates of the MOS transistors T1 and T4. Next, a high level is fed as the signal φVRS2 to the gate of the MOS transistor T7 to turn this MOS transistor T7 on and thereby initialize the potential at the capacitor C, and thus at the node "a".

Third Embodiment

Figure 9:
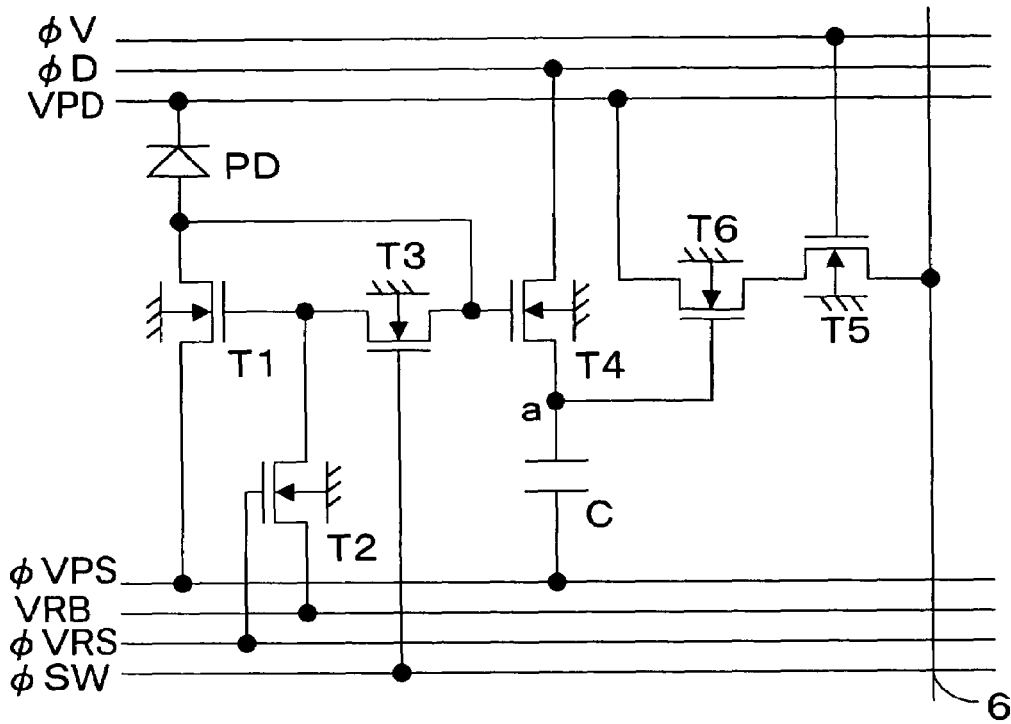
FIG. 9 is a circuit diagram showing the configuration of each pixel in a third embodiment of the invention.

Next, a third embodiment of the invention will be described with reference to the drawings. FIG. 9 is a circuit diagram showing the configuration of each pixel of the solid-state image-sensing device of this embodiment. It is to be noted that such elements, signal lines, and others as are used for the same purposes here as in the pixel shown in FIG. 8 are identified with the same reference symbols, and their detailed descriptions will be omitted.

As shown in FIG. 9, in this embodiment, the initialization of the potential at the capacitor C, and thus at the node "a", is achieved by feeding the signal φD to the drain of the MOS transistor T4, and thus the MOS transistor T7 found in the previous embodiment is omitted. In other respects, each pixel of this embodiment is configured in the same manner as in the second embodiment (FIG. 8). Here, while the signal φD is kept at a high level, the capacitor C performs integration; while the signal φD is kept at a low level, the electric charge accumulated in the capacitor C is discharged through the MOS transistor T4 to make the voltage at the capacitor C, and thus at the gate of the MOS transistor T6, approximately equal to the low-level voltage of the signal φD (that is, the voltage is reset). In this embodiment, the omission of the MOS transistor T7 helps simplify the circuit configuration.

In this embodiment, compensation data of the pixel is acquired in the following manner. The MOS transistor T3 is turned off to bring the MOS transistors T1 and T4 into a state equivalent to when their gates are disconnected from each other. In addition, the MOS transistor T2 is turned on to apply the direct-current voltage VRB to the gate of the MOS transistor T1. Furthermore, the signal φD is turned to a high level (for example, to a voltage approximately equal to the direct-current voltage VPD), and, as in the first embodiment (FIGS. 4B and 4C), the voltage of the signal φVPS is turned first to a low level and then back to a high level so that a negative electric charge is accumulated at the drain of the MOS transistor T1. In accordance with the drain voltage of the MOS transistor T1 that varies with this negative electric charge, a current flows through the MOS transistor T4, causing an electric charge to be accumulated in the capacitor C and thus causing the potential at the node "a" to rise.

Then, with predetermined timing, the MOS transistor T5 is turned on so that a current proportional to the voltage applied to the gate of the MOS transistor T6 in accordance with the voltage appearing at the node "a" is fed to the output signal line 6. The output current thus fed to the output signal line 6 is proportional to the threshold voltage VTH of the MOS transistor T1, and therefore, on the basis of this output current, it is possible to acquire compensation data to be used to correct the outputs from the individual pixels. Moreover, as in the second embodiment, this current proportional to the threshold voltage VTH is fed out serially, from one pixel after another, by way of the signal line 9 shown in FIG. 6 so that the succeeding circuit stores it in a memory as compensation data for the individual pixels. Thus, during actual image sensing, by using the compensation data thus stored, it is possible to eliminate from the output signal the components resulting from variations in sensitivity of the individual pixels. A practical example of how this compensation is achieved is shown in FIG. 20 and will be described later.

Thereafter, the MOS transistor T5 is turned off, and the signal φD is turned to a low level (a voltage lower than the signal φVPS) so that, through the MOS transistor T4, the electric charge in the capacitor C is discharged therefrom to the signal line of the signal φD and thereby the potential at the capacitor C, and thus at the node "a", is initialized. Subsequently, the MOS transistor T3 is turned on so that, through the MOS transistors T2 and T3, the electric charges accumulated in the photodiode PD, at the drain of the MOS transistor T1, and at the gate of the MOS transistor T4 are discharged and thereby those elements are initialized.

On the other hand, image sensing is performed in the following manner. In a case where the output current is produced by converting the photoelectric current natural-logarithmically, the MOS transistor T3 is kept on, and the MOS transistor T2 is kept off. Moreover, the signal φVPS is turned to a low level, and the signal φD is turned to a high level so that an electric charge equivalent to the value obtained by converting the integral of the photoelectric current natural-logarithmically is accumulated in the capacitor C. Then, with predetermined timing, the MOS transistor T5 is turned on so that a current proportional to the voltage applied to the gate of the MOS transistor T6 is fed through the MOS transistors T5 and T6 to the output signal line 6.

Thereafter, the MOS transistor T5 is turned off, and the signal φD is turned to a low level. As a result, the electric charge accumulated in the capacitor C flows through the MOS transistor T4 to the signal line of the signal φD, and thereby the voltage at the capacitor C, and thus at the node "a", is initialized.

By contrast, in a case where the output current is produced by converting the photoelectric current linearly, first, the MOS transistor T3 is kept on, and the MOS transistor T2 is turned off. Moreover, the signal φVPS and the signal φD are turned to a high level. Then, an initialization operation is performed using the MOS transistor T4 so as to turn the voltage at the node "a" to a voltage lower than the direct-current voltage VPD as in the second embodiment. In this state, an electric charge equivalent to the value obtained by converting the integral of the photoelectric current linearly is accumulated in the capacitor C. Then, with predetermined timing, the MOS transistor T5 is turned on so that a current proportional to the voltage applied to the gate of the MOS transistor T6 is fed through the MOS transistors T5 and T6 to the output signal line 6.

Thereafter, first, the MOS transistor T2 is turned on so as to initialize the photodiode PD, the drain of the MOS transistor T1, and the gates of the MOS transistors T1 and T4. Subsequently, the signal φD is turned to a low level so that the electric charge accumulated in the capacitor C is discharged through the MOS transistor T4 to the signal line of the signal φD, and thereby the voltage at the node "a" is initialized to a voltage lower than the signal φVPS.

Fourth Embodiment

Figure 10:
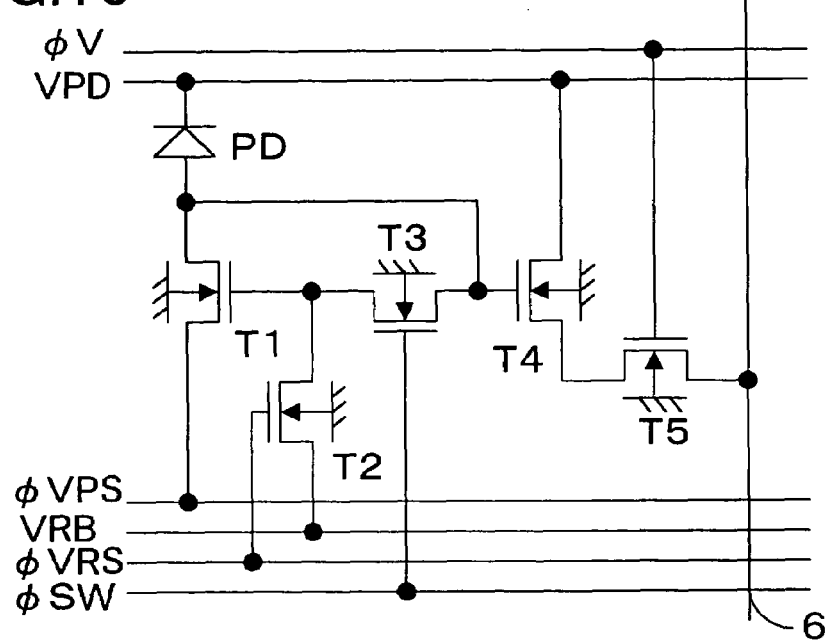
FIG. 10 is a circuit diagram showing the configuration of each pixel in a fourth embodiment of the invention.

Next, a fourth embodiment of the invention will be described with reference to the drawings. FIG. 10 is a circuit diagram showing the configuration of each pixel of the solid-state image-sensing device of this embodiment. It is to be noted that such elements, signal lines, and others as are used for the same purposes here as in the pixel shown in FIG. 9 are identified with the same reference symbols, and their detailed descriptions will be omitted.

As shown in FIG. 10, in this embodiment, the direct-current voltage VPD is applied to the drain of the MOS transistor T4, and the capacitor C and the MOS transistor T6 found in the previous embodiment are omitted. That is, the MOS transistor T4 has its source connected to the drain of the MOS transistor T5, and receives at its drain the direct-current voltage VPD. In other respects, each pixel of this embodiment is configured in the same manner as in the third embodiment (FIG. 9).

In this pixel having a circuit configuration as described above, compensation data is acquired in the following manner. As in the third embodiment, the MOS transistor T2 is kept on and the MOS transistor T3 is kept off so that the MOS transistors T1 and T4 are kept in a state equivalent to when their gates are disconnected from each other. In addition, the direct-current voltage VRB is applied to the gate of the MOS transistor T1. Moreover, as in the first embodiment (FIGS. 4B and 4C), the voltage of the signal φVPS is turned first to a low level and then back to a high level so that a negative electric charge is accumulated at the drain of the MOS transistor T1. In accordance with the drain voltage of the MOS transistor T1 that varies with this negative electric charge, a current flows through the MOS transistor T4.

Then, with predetermined timing, the MOS transistor T5 is turned on so that a current proportional to the voltage applied to the gate of the MOS transistor T4 is fed to the output signal line 6. The output current thus fed to the output signal line 6 is proportional to the threshold voltage VTH of the MOS transistor T1, and therefore, on the basis of this output current, it is possible to acquire compensation data to be used to correct the outputs from the individual pixels. Moreover, as in the third embodiment, this current proportional to the threshold voltage VTH is fed out serially, from one pixel after another, by way of the signal line 9 shown in FIG. 6 so that the succeeding circuit stores it in a memory as compensation data for the individual pixels. Thus, during actual image sensing, by using the compensation data thus stored, it is possible to eliminate from the output signal the components resulting from variations in sensitivity of the individual pixels. A practical example of how this compensation is achieved is shown in FIG. 20 and will be described later.

After the acquisition of compensation data as described above, first, the MOS transistor T5 is turned off, and then the MOS transistor T3 is turned on. As a result, through the MOS transistors T2 and T3, the electric charges accumulated in the photodiode PD, at the drain of the MOS transistor T1, and at the gate of the MOS transistor T4 are discharged and thereby those elements are initialized.

In the pixel shown in FIG. 10, as in the third embodiment, by keeping the MOS transistor T3 on and switching the voltage of the signal φVPS so as to switch the bias to the MOS transistor T1, it is possible to switch between two modes of conversion so as to allow the output signal fed to the output signal line 6 to vary either natural-logarithmically or linearly with respect to the photoelectric current.

As a result of the voltage of the signal φVPS being switched in such a way that the gate voltage of the MOS transistor T4 varies either natural-logarithmically or linearly with respect to the photoelectric current generated in the photodiode PD, a current having the value proportional either natural-logarithmically or linearly to the photoelectric current flows through the MOS transistor T4 as its drain current. Then, when the signal φV is fed to the gate of the MOS transistor T5 to turn this MOS transistor T5 on, a current having the value proportional either natural-logarithmically or linearly to the photoelectric current flows through the MOS transistor T5 as its drain current to the output signal line 6. At this time, the drain voltage of the MOS transistor Q1 (FIG. 6), which is determined by the on-state resistances of the MOS transistors T4 and Q1 and the current flowing therethrough, appears as the output signal on the output signal line 6. After the signal has been read in this way, the MOS transistor T5 is turned off. In a case where the signal thus read is proportional linearly to the amount of incident light, after the signal has been read, the MOS transistor T2 is turned on so as to initialize the photodiode PD, the drain of the MOS transistor T1, and the gates of the MOS transistors T1 and T4.

In this embodiment, it is not necessary to perform integration of the photoelectric signal by the use of a capacitor C as performed in the third embodiment described above, and thus no time is required for such integration, nor is it necessary to reset the capacitor C. This ensures accordingly faster signal processing. Moreover, as compared with the third embodiment, the capacitor C and the MOS transistor T6 can be omitted, and this helps further simplify the circuit configuration and reduce the pixel size.

Fifth Embodiment

Figure 11:
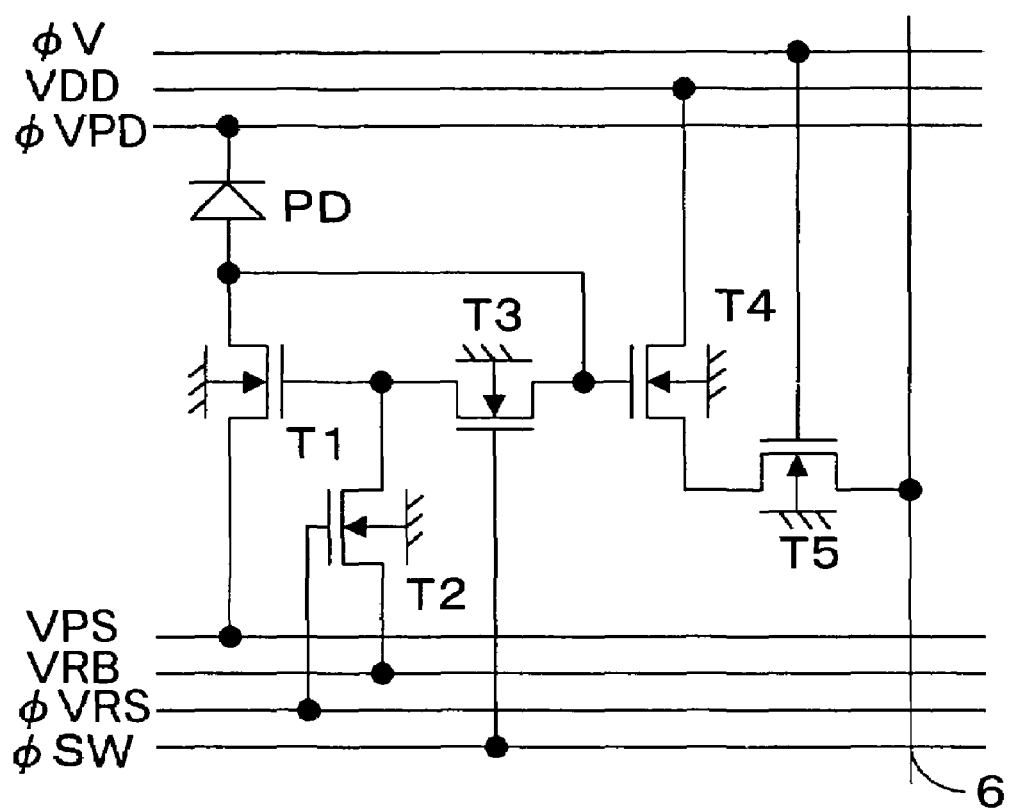
FIG. 11 is a circuit diagram showing the configuration of each pixel in a fifth embodiment of the invention.

Next, a fifth embodiment of the invention will be described with reference to the drawings. FIG. 11 is a circuit diagram showing the configuration of each pixel of the solid-state image-sensing device of this embodiment. It is to be noted that such elements, signal lines, and others as are used for the same purposes here as in the pixel shown in FIG. 10 are identified with the same reference symbols, and their detailed descriptions will be omitted.

As shown in FIG. 11, in this embodiment, the signal φVPD is fed to the cathode of the photodiode PD, a direct-current voltage VPS is applied to the source of the MOS transistor T1, and a direct-current voltage VDD is applied to the drain of the MOS transistor T4. In other respects, each pixel of this embodiment is configured in the same manner as in the fourth embodiment (FIG. 10).

In this pixel having a circuit configuration as described above, compensation data is acquired in the following manner. As in the fourth embodiment, the MOS transistor T2 is kept on and the MOS transistor T3 is kept off so that the MOS transistors T1 and T4 are kept in a state equivalent to when their gates are disconnected from each other. In addition, the direct-current voltage VRB is applied to the gate of the MOS transistor T1.

Then, the voltage of the signal φVPD is increased so as to bring the drain, sub-gate region, and source of the MOS transistor T1 into a potential relationship as shown in FIG. 4B. This causes a negative electric charge to be accumulated between the drain and source of the MOS transistor T1. Thereafter, the voltage of the signal φVPD is lowered to make the MOS transistor T1 have a potential relationship as shown in FIG. 4C. As a result, the electric charge accumulated at the sub-gate region and source of the MOS transistor T1 is discharged, and thus an electric charge remains accumulated only at the drain of the MOS transistor 1. In accordance with the drain voltage of the MOS transistor 1 that varies with this negative electric charge, a current flows through the MOS transistor T4.

Then, as in the fourth embodiment, with predetermined timing, the MOS transistor T5 is turned on so that a current proportional to the voltage applied to the gate of the MOS transistor T4 is fed to the output signal line 6. The output current thus fed to the output signal line 6 is proportional to the threshold voltage VTH of the MOS transistor T1, and therefore, on the basis of this output current, it is possible to acquire compensation data to be used to correct the outputs from the individual pixels. Moreover, as in the fourth embodiment, this current proportional to the threshold voltage VTH is fed out serially, from one pixel after another, by way of the signal line 9 shown in FIG. 6 so that the succeeding circuit stores it in a memory as compensation data for the individual pixels. Thus, during actual image sensing, by using the compensation data thus stored, it is possible to eliminate from the output signal the components resulting from variations in sensitivity of the individual pixels. A practical example of how this compensation is achieved is shown in FIG. 20 and will be described later.

After the acquisition of compensation data as described above, first, the MOS transistor T5 is turned off, and then the MOS transistor T3 is turned on. As a result, through the MOS transistors T2 and T3, the electric charges accumulated in the photodiode PD, at the drain of the MOS transistor T1, and at the gate of the MOS transistor T4 are discharged and thereby those elements are initialized.

In the pixel shown in FIG. 11, image sensing is performed in the following manner. The MOS transistor T3 is kept on, and the signal φVPD fed to the cathode of the photodiode PD is turned to a level higher than the direct-current voltage VPS so as to permit the MOS transistors T1 and T4 to operate in a threshold region. In this state, when the MOS transistor T5 is turned on, it is possible to read a signal (output current) that is proportional to the logarithm of the amount of incident light. On the other hand, when the signal φVPD fed to the cathode of the photodiode PD is turned to a level as low as the direct-current voltage VPS and then the MOS transistor T5 is turned on, it is possible to read a signal proportional to the amount of incident light.

Thus, this embodiment is different from the fourth embodiment simply in that, here, the signal φVPD and the direct-current voltage VPS are used in place of the direct-current voltage VPD and the signal φVPS, respectively, used in the fourth embodiment. Accordingly, to switch between two modes of conversion so as to allow the output signal to vary either natural-logarithmically or linearly with respect to the amount of incident light as described above, the level of the signal φVPD is switched in this embodiment instead of switching the level of the signal φVPS as in the fourth embodiment. In other respects, the circuit of this embodiment operates in the same manner as that of the fourth embodiment.

In all of the first to fifth embodiments described thus far, the MOS transistors T1 to T7 provided within each pixel as active elements are all composed of N-channel MOS transistors; however, these MOS transistors T1 to T7 may be composed of P-channel MOS transistors instead. FIGS. 13 and 16 to 19 show sixth to tenth embodiments, which are examples of modified versions of the first to fifth embodiments described above in which P-channel MOS are used. Accordingly, in FIGS. 12 to 19, all the elements used and the voltages applied have the opposite polarities. For example, in FIG. 13 (the sixth embodiment), the direct-current voltage VPD is connected to the anode of the photodiode PD, and the cathode thereof is connected to the drain of the first MOS transistor T1 and to the gate of the fourth MOS transistor T4. The signal φVPS is fed to the source of the first MOS transistor T1.

Figure 13:
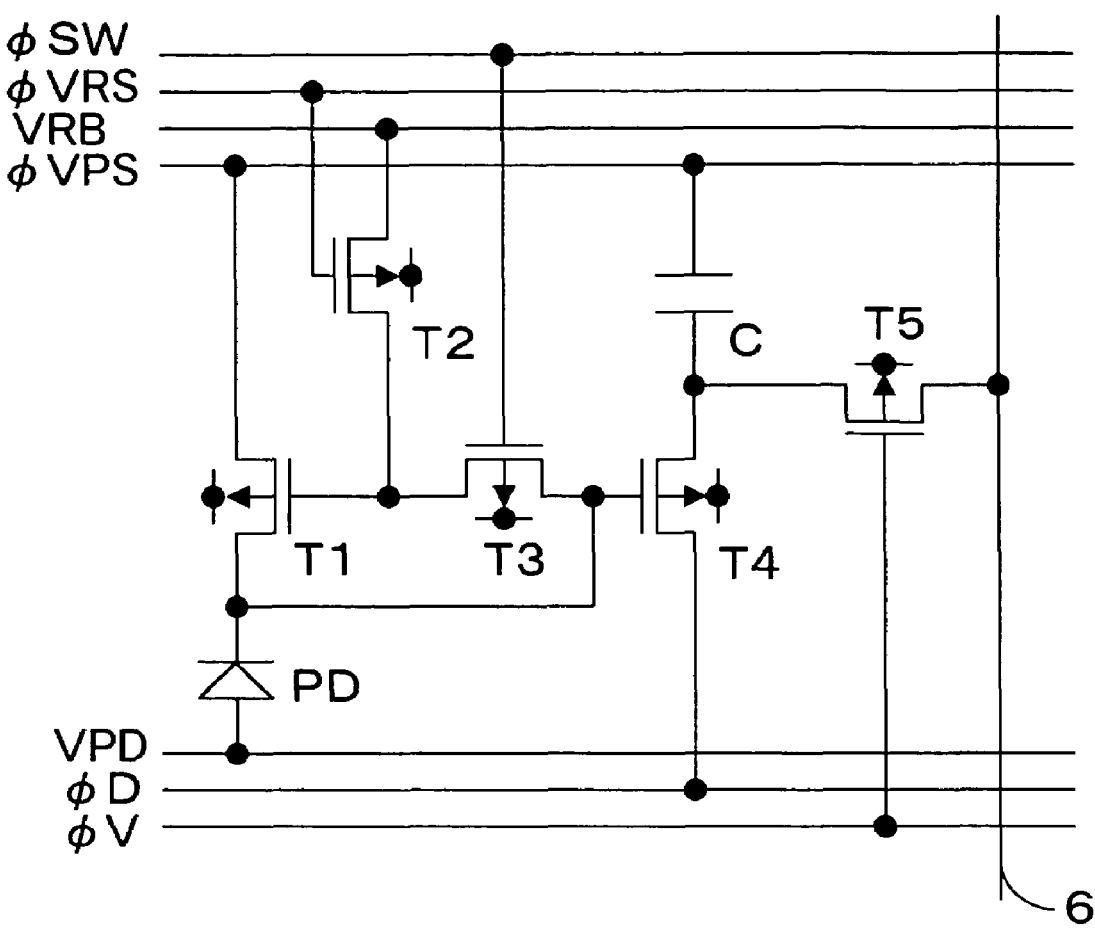
FIG. 13 is a circuit diagram showing the configuration of each pixel in a sixth embodiment of the invention.

When logarithmic conversion is performed in a pixel as shown in FIG. 13, the voltage of the signal φVPS and the direct-current voltage VPD fulfill the relation φVPS>VPD, thus an inverted relation as compared with the case shown in FIG. 3 (the first embodiment). Moreover, the output voltage of the capacitor C is initially high, and drops as a result of integration. Moreover, when the second, third, or fifth MOS transistor T2, T3, or T5 is turned on, a low voltage is applied to the gate thereof. Furthermore, in the embodiment shown in FIG. 16 (the seventh embodiment), when the seventh MOS transistor T7 is turned on, a low voltage is applied to the gate thereof. As described above, in cases where P-channel MOS transistors are used, although how the voltages are applied and the elements are connected differs partially, the circuits are configured substantially in the same manner and operate basically in the same manner. Therefore, with respect to the sixth to tenth embodiments, only illustrations are given in FIGS. 13 and 16 to 19, and no descriptions will be given of their configuration and operation.

Figure 12:
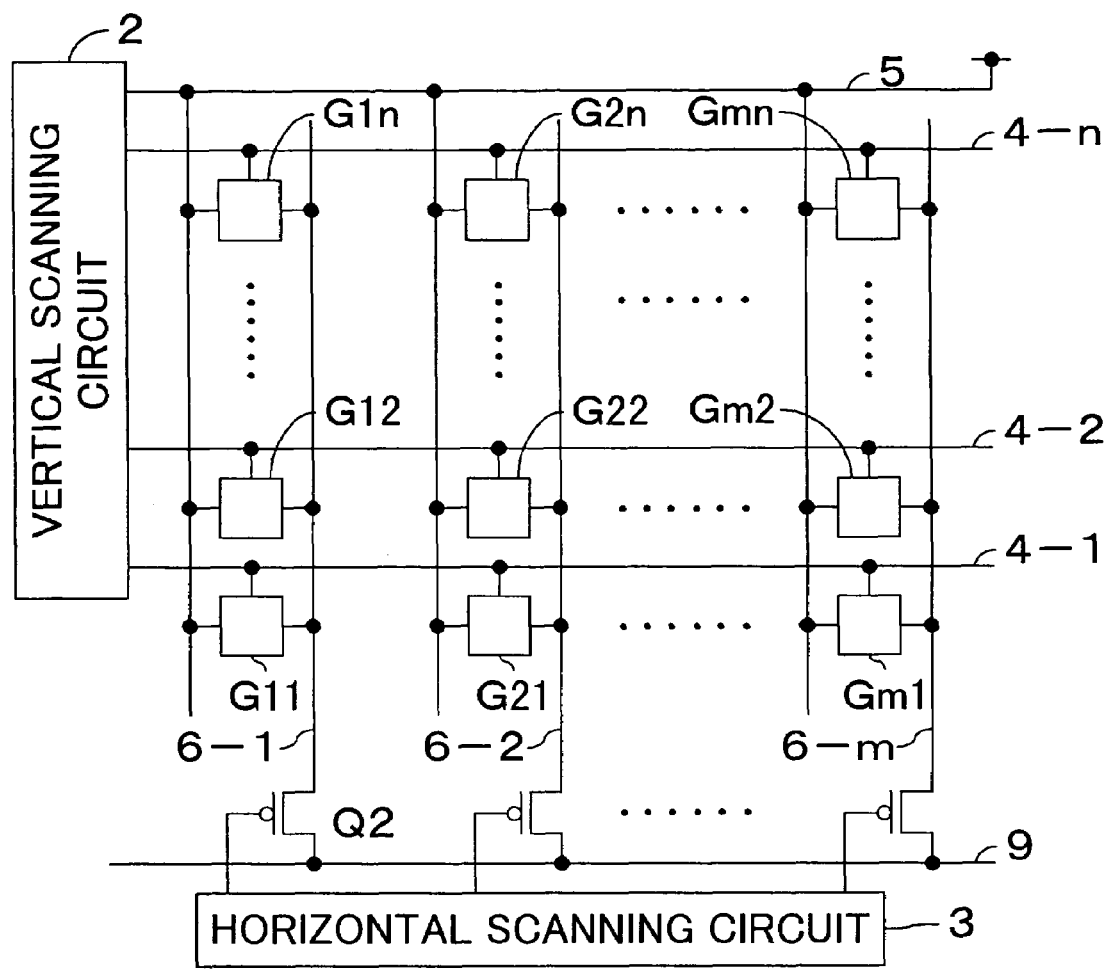
FIG. 12 is a block circuit diagram illustrating the overall configuration of a two-dimensional solid-state image-sensing device embodying the invention, in a case where the active elements within a pixel are composed of P-channel MOS transistors.
Figure 14:
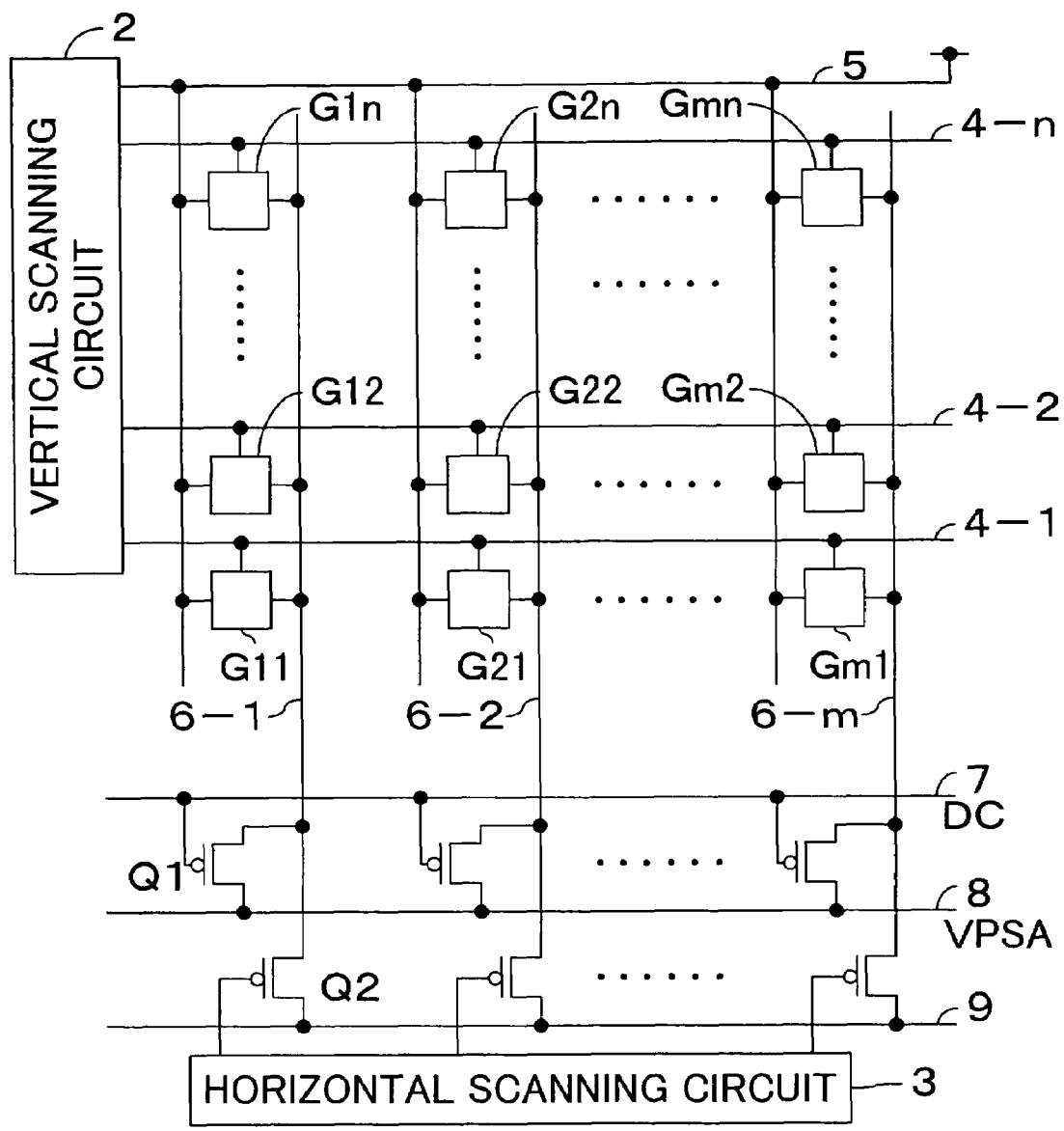
FIG. 14 is a block circuit diagram illustrating the overall configuration of another two-dimensional solid-state image-sensing device embodying the invention, in a case where the active elements within a pixel are composed of P-channel MOS transistors.
Figure 15A:
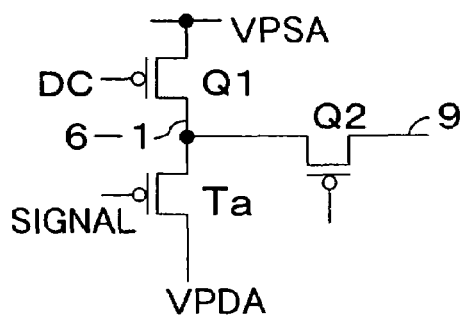
FIGS. 15A and 15B are circuit diagrams of a portion of the circuit shown in FIG. 14.

FIG. 12 is a block circuit configuration diagram illustrating the overall configuration of a solid-state image-sensing device 1 having pixels configured according to the sixth embodiment, and FIG. 14 is a block circuit configuration diagram illustrating the overall configuration of a solid-state image-sensing device 1 having pixels configured according to one of the seventh to tenth embodiments. As to FIGS. 12 and 14, such elements as are found also (i.e. as play the same roles as) in FIGS. 2 and 6 are identified with the same reference symbols, and their descriptions will be omitted. Here, a brief description will be given of the configuration shown in FIG. 14. A P-channel MOS transistor Q1 and a P-channel MOS transistor Q2 are connected to each of output signal lines 6-1, 6-2, . . . , 6-m that are laid in the column direction. The MOS transistor Q1 has its gate connected to a direct-current voltage line 7, has its drain connected to the output signal line 6-1, and has its source connected to a direct-current voltage VPSA line 8. On the other hand, the MOS transistor Q2 has its drain connected to the output signal line 6-1, has its source connected to a signal line 9 serving as a final destination line, and has its gate connected to a horizontal scanning circuit 3. Here, the MOS transistor Q1, together with a P-channel MOS transistor Ta provided within each pixel, constitutes an amplifier circuit as shown in FIG. 15A. This MOS transistor Ta corresponds to the sixth MOS transistor T6 in the seventh and eighth embodiments, and corresponds to the fourth MOS transistor T4 in the ninth and tenth embodiments.

Figure 15B:
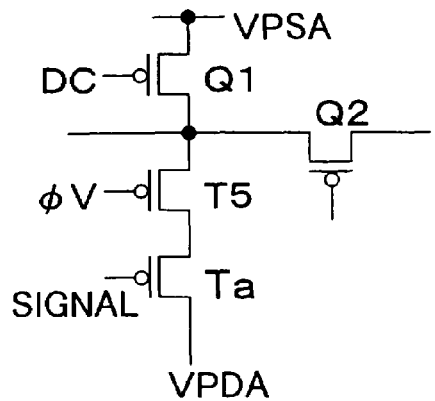
Figure 16:
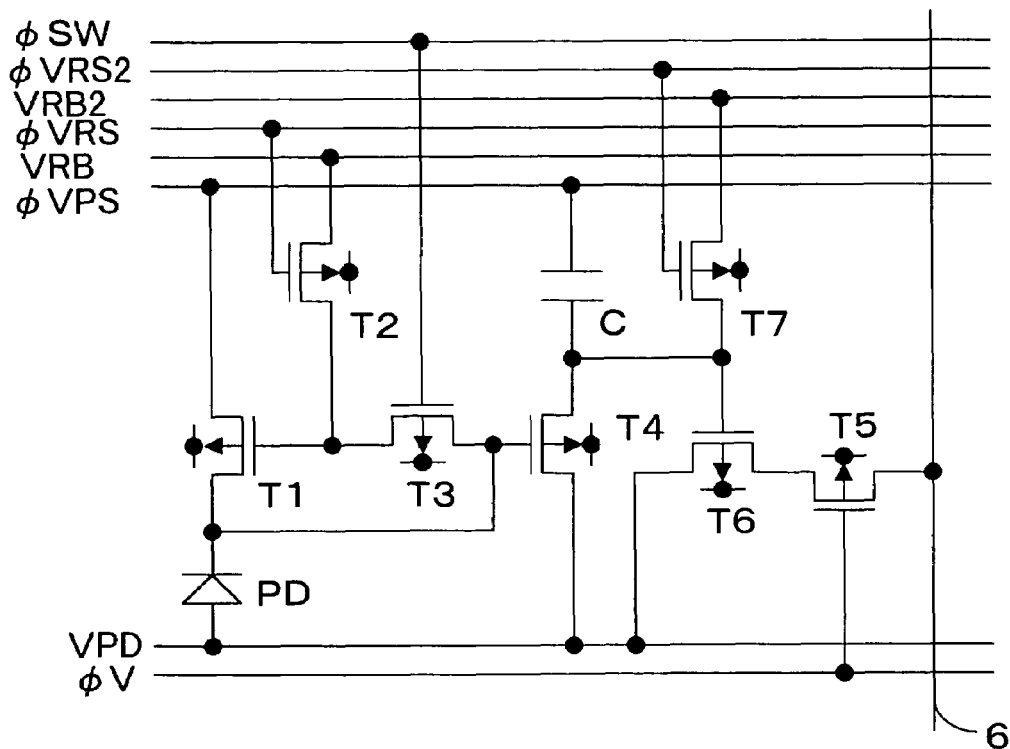
FIG. 16 is a circuit diagram showing the configuration of each pixel in a seventh embodiment of the invention.
Figure 17:
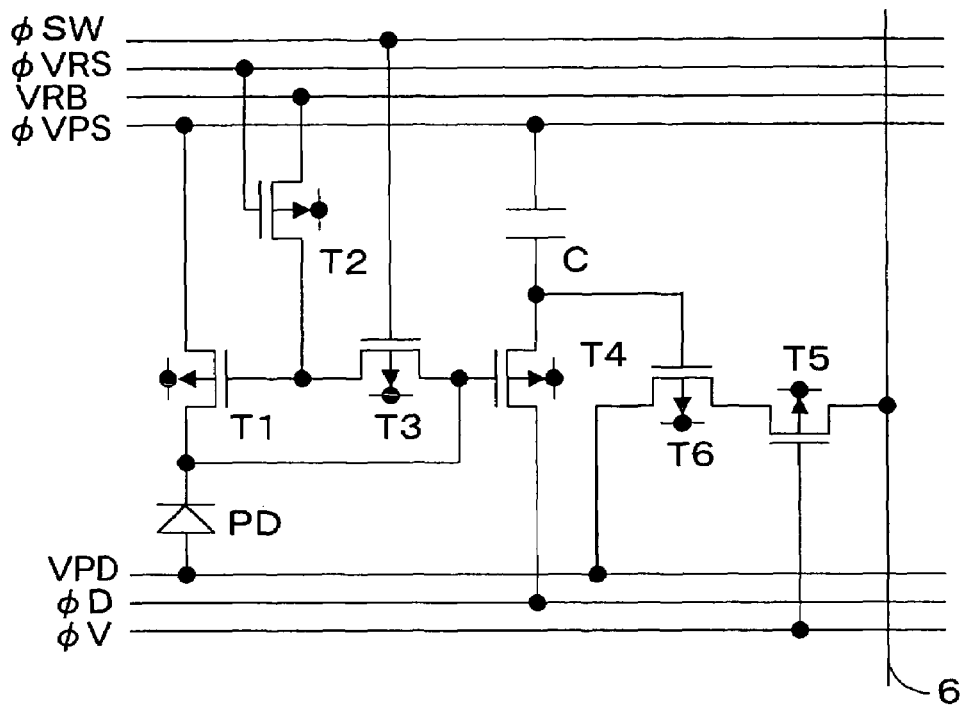
FIG. 17 is a circuit diagram showing the configuration of each pixel in an eighth embodiment of the invention.
Figure 18:
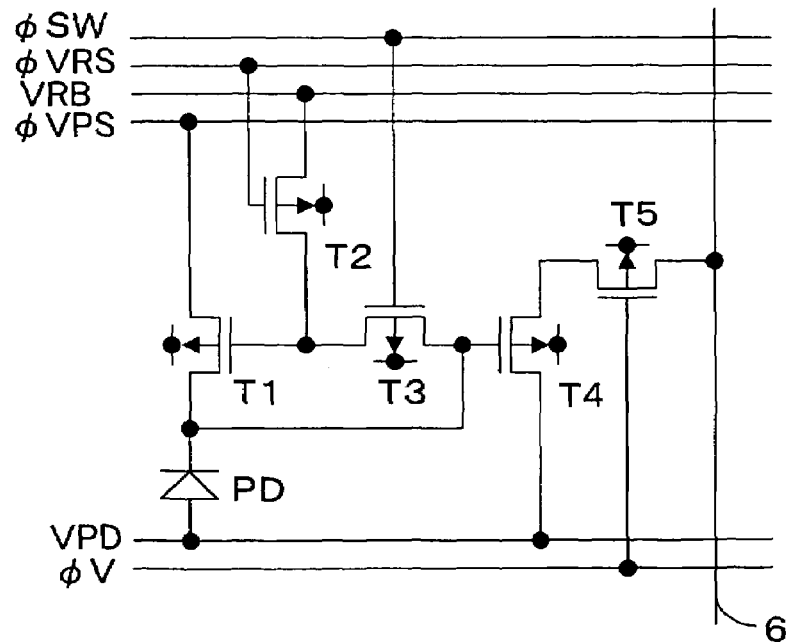
FIG. 18 is a circuit diagram showing the configuration of each pixel in a ninth embodiment of the invention.
Figure 19:
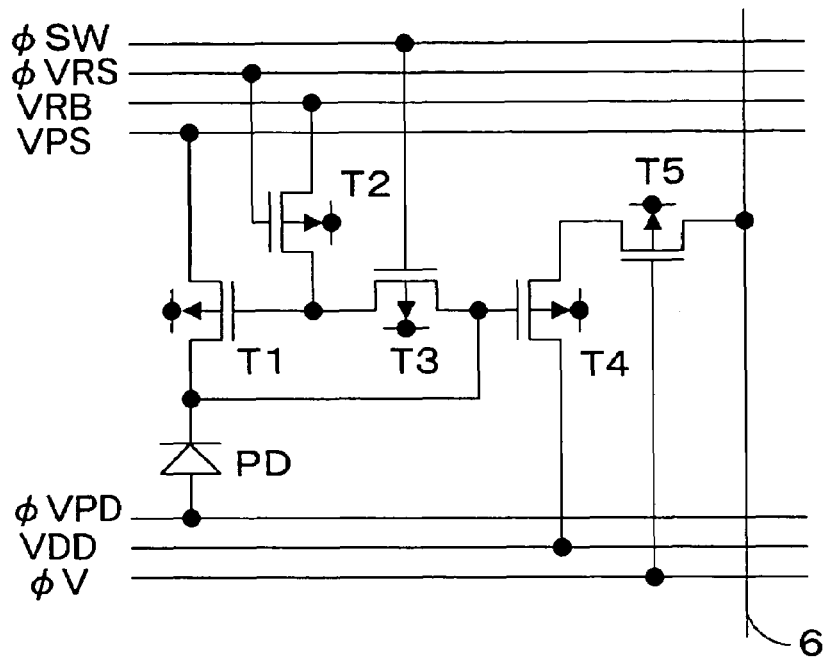
FIG. 19 is a circuit diagram showing the configuration of each pixel in a tenth embodiment of the invention.

Here, the MOS transistor Q1 serves as a load resistor or constant-current source for the MOS transistor Ta. Accordingly, the direct-current voltage VPSA connected to the source of this MOS transistor Q1 and the direct-current voltage VPDA connected to the drain of the MOS transistor Ta fulfill the relation VPDA<VPSA, where the direct-current voltage VPDA is equal to, for example, the ground-level voltage. The MOS transistor Q1 has its drain connected to the MOS transistor Ta, and receives a direct-current voltage at its gate. The P-channel MOS transistor Q2 is controlled by the horizontal scanning circuit 3 so as to feed the output of the amplifier circuit to the signal line 9 that serves as the final destination line. If the fifth MOS transistor T5 provided within each pixel is explicitly illustrated, the circuit shown in FIG. 15A has a circuit configuration as shown in FIG. 15B.

How to Correct Image Data with Pixels of the First to Tenth Embodiments

Now, with reference to the drawings, an embodiment of the invention will be described in which an image-sensing apparatus incorporating a solid-state image-sensing device having pixels configured according to one of the first to tenth embodiments described above is applied to an image input apparatus such as a digital camera.

The image input apparatus shown in FIG. 20 includes the following components. An objective lens 51 introduces the light from a subject into the image input apparatus. An image-sensing apparatus 52 outputs an electric signal in accordance with the amount of light introduced through the objective lens 51. A memory 53 receives the electric signal (hereafter referred to as the "image data") from the image-sensing apparatus 52 and stores it temporarily during image sensing. Another memory 54 stores compensation data. A compensation circuit 55 corrects the image data stored in the memory 53 in accordance with the compensation data stored in the memory 54 by performing predetermined compensation calculation. A signal processor 56 performs predetermined processing on the image data corrected in accordance with the compensation data by the compensation circuit 55 and feeds out the processed image data. Here, the image-sensing apparatus 52 is provided with a solid-state image-sensing device like that of the first example (FIGS. 2 and 12) having pixels configured as in the first or sixth embodiments (FIG. 3 or 13), or a solid-state image-sensing device like that of the second example (FIGS. 6 and 14) having pixels configured as in one of the second to fifth and seventh to tenth embodiments (FIGS. 8 to 11 and 16 to 19).

This image input apparatus configured as described above operates as follows. First, immediately before the start of image sensing, for example, a shutter (not shown) is closed so that the image-sensing apparatus 52 is brought into a dark state in which no light is introduced from the outside into it through the objective lens 51. In this dark state, compensation data is acquired from the individual pixels in the manner described in connection with each embodiment, and is stored in the memory 54. In this memory 54, the compensation data is stored pixel by pixel.

After the compensation data of all the pixels of the image-sensing apparatus 52 has been stored in the memory 54, the shutter is released to start image sensing. When image sensing is started, image data is fed, pixel by pixel, from the image-sensing apparatus 52 to the memory 53. The image data is stored temporarily in the memory 53, and is then fed, pixel by pixel, to the compensation circuit 55. At this time, also the compensation data is simultaneously fed from the memory 54 to the compensation circuit 55. The compensation circuit 55 corrects the image data fed thereto in accordance with the compensation data fed thereto by performing predetermined compensation calculation between the image data and compensation data of corresponding pixels. The image data thus corrected is fed to the signal processor 56, which performs predetermined processing on this image data and then feeds it out. As the memories 53 and 54, there is no need to use frame memories, and it suffices to use line memories. This makes incorporation of these memories into the solid-state image-sensing device easy. In this image input apparatus, it is also possible to omit the memory 53 and feed the image data output from the image-sensing apparatus 52 directly to the compensation circuit 55.

As described above, according to the present invention, it is possible to realize an image-sensing apparatus that permits detection of variations in sensitivity of individual pixels under ambient light. This eliminates the need to illuminate the pixels with uniform light as in a conventional image-sensing apparatus to acquire compensation data used to correct the outputs from the individual pixels during actual shooting of a subject. Moreover, it is possible to freely choose whether to produce an output by converting the electric signal generated in photoelectric conversion devices such as photodiodes logarithmically or linearly. Accordingly, it is possible to make the image-sensing apparatus perform logarithmic conversion when a subject having a wide brightness range is shot and make it perform linear conversion when a dimly-lit subject or a subject having a narrow brightness range is shot. Thus, it is possible to shoot subjects of varying brightness, i.e. from dimly-lit to brightly-lit subjects, with high accuracy. Moreover, active elements can be composed of MOS transistors. This makes high-density integration possible, and thus makes it possible to form them on a single chip together with peripheral processing circuits such as A/D converters, digital system processors, and memories.

What is claimed is:

1. An image-sensing apparatus comprising:
a plurality of pixels, the pixels each comprising:
   a photoelectric conversion portion having a photosensitive element and a field effect transistor configured to produce an electric signal in accordance with amount of incident light and that outputs a signal obtained by converting the electric signal natural-logarithmically;
   a lead-out path by way of which the signal output from the photoelectric conversion portion is fed to an output signal line; and
   a controller that detects a variation in sensitivity of the photoelectric conversion portion of each pixel by causing an electric charge indicative of the threshold voltage of the field effect transistor to accumulate on the field effect transistor and reading out the electric charge via the lead-out path.

2. An image-sensing apparatus as claimed in claim 1, wherein the pixels are arranged in a matrix.

3. An image-sensing apparatus as claimed in claim 1, wherein the pixels each further comprise an amplifying transistor that amplifies the signal output from the photoelectric conversion portion so that a signal output from the amplifying transistor is fed by way of the lead-out path to the output signal line.

4. An image-sensing apparatus as claimed in claim 3, further comprising:
load resistors or constant-current sources connected to the output signal line, a total number of the load resistors or constant-current sources being smaller than a total number of the pixels.

5. An image-sensing apparatus as claimed in claim 4, wherein the load resistors or constant-current sources each comprise a resistive transistor having a first electrode connected to the output signal line, a second electrode connected to a direct-current voltage, and a control electrode connected to a direct-current voltage.

6. An image-sensing apparatus as claimed in claim 1, wherein the lead-out path includes a switch that selects one after another of the pixels in a predetermined sequence and feeds the signal output from the selected pixel to the output signal line.

7. An image-sensing apparatus as claimed in claim 1, wherein, during image sensing, the pixels can each operate selectively either in a first state in which the photoelectric conversion portion converts the electric signal linearly and in a second state in which the photoelectric conversion portion converts the electric signal natural logarithmically.

8. An image-sensing apparatus as claimed in claim 1, wherein the controller detects variations in sensitivity of the photoelectric conversion portion of the individual pixels with the photosensitive elements of the individual pixels kept in a dark state.

9. An image-sensing apparatus comprising:
a plurality of pixels, the pixels each comprising:
   a photoelectric conversion portion that has a photosensitive element for producing an electric signal in accordance with amount of incident light and that outputs a signal obtained by converting the electric signal natural-logarithmically;
   a lead-out path by way of which the signal output from the photoelectric conversion portion is fed to an output signal line; and
   an amplifying transistor that amplifies the signal output from the photoelectric conversion portion so that a signal output from the amplifying transistor is fed by way of the lead-out path to the output signal line; the amplifying transistor being a P-channel MOS transistor;
load resistors or constant-current sources connected to the output signal line, a total number of the load resistors or constant-current sources being smaller than a total number of the pixels, each load resistor or constant-current source including a resistive transistor having a first electrode connected to the output signal line, a second electrode connected to a direct-current voltage, and a control electrode connected to a direct-current voltage; and
a controller that detects a variation in sensitivity of the photoelectric conversion portion of each pixel by injecting an electric charge into the photoelectric conversion portion,
wherein a direct-current voltage applied to a first electrode of the amplifying transistor is lower than the direct-current voltage applied to the second electrode of the resistive transistor.

10. An image-sensing apparatus comprising:
a plurality of pixels, the pixels each comprising:
   a photoelectric conversion portion that has a photosensitive element for producing an electric signal in accordance with amount of incident light and that outputs a signal obtained by converting the electric signal natural-logarithmically; each photoelectric conversion portion including:
      a first electrode to which a direct-current voltage is applied and a second electrode;
      a first transistor having a first electrode connected to the second electrode of the photosensitive element, a second electrode, and a control electrode, the first transistor receiving an output current from the photoelectric element; and
      a second transistor having a first electrode to which a direct-current voltage is applied, a second electrode from which an electric signal is output, and a control electrode connected to the first electrode of the first transistor;

a lead-out path by way of which the signal output from the photoelectric conversion portion is fed to an output signal line;

a first switching portion for applying a direct-current voltage to the control electrode of the first transistor; and a second switching portion provided between the control electrode of the first transistor and the control electrode of the second transistor; and a controller that detects a variation in sensitivity of the photoelectric conversion portion of each pixel by injecting an electric charge into the photoelectric conversion portion, wherein the controller detects variations in sensitivity of the individual pixels by turning on the first switching portion and turning off the second switching portion so that a predetermined direct-current voltage is applied to the control electrode of the first transistor and that the control electrodes of the first and second transistors are brought into a cut-off state, and wherein the controller makes the individual pixels perform image sensing by turning off the first switching portion and turning on the second switching portion so that the control electrodes of the first and second transistors are brought into a connected state.

11. An image-sensing apparatus as claimed in claim 10, wherein the first switching portion is a third transistor having a first electrode connected to the control electrode of the first transistor, a second electrode to which a direct-current voltage is applied, and a control electrode, wherein the second switching portion is a fourth transistor having a first electrode connected to the control electrode of the first transistor, a second electrode connected to the control electrode of the second transistor, and a control electrode, wherein the controller detects variations in sensitivity of the individual pixels by feeding a signal to the control electrode of the third transistor so as to turn on the third transistor and turning off the fourth transistor so that a predetermined direct-current voltage is applied to the control electrode of the first transistor and that the control electrodes of the first and second transistors are brought into a cut-off state, and wherein the controller makes the individual pixels perform image sensing by turning off the third transistor and feeding a signal to the control electrode of the fourth transistor so as to turn on the fourth transistor so that the control electrodes of the first and second transistors are brought into a connected state.

12. An image-sensing apparatus as claimed in claim 10, wherein, during image sensing, the pixels can each operate selectively either in a first state in which the photoelectric conversion portion converts the electric signal linearly and in a second state in which the photoelectric conversion portion converts the electric signal natural logarithmically, and wherein the controller switches the individual pixels between the first and second states by varying a voltage difference between the first and second electrodes of the first transistor of the photoelectric conversion portion of each pixel.

13. An image-sensing apparatus comprising:

a plurality of pixels, the pixels each comprising:

a photodiode, having two electrodes, for producing an electric signal in accordance with amount of incident light;

a first MOS transistor having a first electrode connected to one of the electrodes of the photodiode, a second electrode, and a gate electrode;

a second MOS transistor having a first electrode connected to the gate electrode of the first MOS transistor, a second electrode to which a direct-current voltage is applied, and a gate electrode;

a third MOS transistor having a first electrode connected to the gate electrode of the first MOS transistor, a second electrode connected to the first electrode of the first MOS transistor, and a gate electrode; and a fourth MOS transistor having a first electrode, a second electrode, and a gate electrode connected to the first electrode of the first MOS transistor; and a controller that detects variations in sensitivity of the individual pixels by feeding a signal to the gate electrode of the second MOS transistor so as to turn on the second MOS transistor and turning off the third MOS transistor so that a predetermined direct-current voltage is applied to the gate electrode of the first MOS transistor and that the gate electrodes of the first and fourth MOS transistors are brought into a cut-off state, wherein the controller makes the individual pixels perform image sensing by turning off the second MOS transistor and feeding a signal to the gate electrode of the third MOS transistor so as to turn on the third MOS transistor so that the gate electrodes of the first and fourth MOS transistors are brought into a connected state.

14. An image-sensing apparatus as claimed in claim 13, wherein, when making the individual pixels perform image sensing, the controller, in a case where the electric signal output from the photodiode is converted natural-logarithmically and is output from the second electrode of the fourth MOS transistor, makes the first MOS transistor operate in a subthreshold region below a threshold value thereof, and, in a case where the electric signal output from the photodiode is converted linearly and is output from the second electrode of the fourth MOS transistor, brings a potential of the second electrode of the first MOS transistor and a potential of the other electrode of the photodiode closer together so as to bring the first MOS transistor into an inactive state and, after allowing the electric signal to be output, performs resetting so that electric charges accumulated at the first and gate electrodes of the first MOS transistor are discharged by switching a level of a voltage applied to the gate electrode of the second MOS transistor so as to bring the second MOS transistor into a conducting state.

15. An image-sensing apparatus as claimed in claim 13, wherein the pixels each further comprise a sixth MOS transistor, having a first electrode to which a direct-current voltage is applied, a second electrode, and a gate electrode connected to the second electrode of the fourth MOS transistor, for amplifying an output signal output from the second electrode of the fourth transistor.

16. An image-sensing apparatus as claimed in claim 13, further comprising:

MOS transistors connected by way of output signal lines to the individual pixels so as to serve as load resistors or constant-current sources.

17. An image-sensing apparatus as claimed in claim 13, wherein the controller detects variations in sensitivity of the individual pixels with the photodiodes of the individual pixels kept in a dark state.

18. An image-sensing apparatus comprising:
a plurality of pixels, the pixels each comprising:
   a photoelectric conversion portion including a photosensitive element and a field effect transistor configured to produce an electric signal in accordance with an amount of incident light;
   a lead-out path by way of which the electric signal output from the photoelectric conversion portion is fed to an output signal line; and
   an integrator circuit that integrates the electric signal output from the photoelectric conversion portion, the integrator circuit including a first transistor to which the electric signal output from the photoelectric conversion portion is fed and a capacitive element connected to the first transistor so that the signal integrated by the integrator circuit is fed by way of the lead-out path to the output signal line; and
   a controller that detects a variation in sensitivity of the photoelectric conversion portion of each pixel by causing an electric charge indicative of the threshold voltage of the field effect transistor to accumulate on the field effect transistor and reading out the electric charge via the lead-out path.

19. An image-sensing apparatus as claimed in claim 18, wherein the pixels further comprise a second transistor that turns on and off the electric signal output to the output signal line.

20. An image-sensing apparatus as claimed in claim 18, wherein the pixels further comprise a third transistor that amplifies the electric signal output from the photoelectric conversion portion.

21. An image-sensing apparatus as claimed in claim 18, further comprising a load resistor or a constant-current source connected to the output signal line.

22. An image-sensing apparatus as claimed in claim 18, wherein each pixel, when performing image sensing, operates selectively either in a first state in which the photoelectric conversion portion converts the electric signal linearly or in a second state in which the photoelectric conversion portion converts the electric signal natural-logarithmically.

23. An image-sensing apparatus comprising:
a plurality of pixels, the pixels each comprising:
   a photoelectric conversion portion including:
      a photosensitive element for producing an electric signal in accordance with an amount of incident light, the photosensitive element having first and second electrodes to which a direct-current voltage is applied; and
      a first transistor having a first electrode connected to the second electrode of the photosensitive element, a second electrode, and a control electrode, the first transistor receiving an output current from the photoelectric element, the first transistor having a plurality of potentials applied to the second electrode; and
   a lead-out path by way of which the electric signal output from the photoelectric conversion portion is fed to an output signal line; and
   a controller that detects a variation in sensitivity of the photoelectric conversion portion of each pixel by injecting an electric charge into the photoelectric conversion portion.

24. An image-sensing apparatus as claimed in claim 23, wherein the pixels further comprise a second transistor that turns on and off the electric signal output to the output signal line.

25. An image-sensing apparatus as claimed in claim 23, wherein the pixels further comprise a third transistor that amplifies the electric signal output from the photoelectric conversion portion.

26. An image-sensing apparatus as claimed in claim 23, further comprising a load resistor or a constant-current source connected to the output signal line.

27. An image-sensing apparatus as claimed in claim 23, wherein each pixel, when performing image sensing, operates selectively either in a first state in which the photoelectric conversion portion converts the electric signal linearly or in a second state in which the photoelectric conversion portion converts the electric signal natural-logarithmically.

28. An image-sensing apparatus comprising:
a plurality of pixels, the pixels each comprising:
   a photoelectric conversion portion including:
      a photosensitive element for producing an electric signal in accordance with an amount of incident light, the photosensitive element having first and second electrodes to which a direct-current voltage is applied; and
      a first transistor having a first electrode connected to the second electrode of the photosensitive element, a second electrode, and a control electrode, the first transistor receiving an output current from the photoelectric element, the first transistor having a plurality of potentials applied to the second electrode;
   a lead-out path by way of which the electric signal output from the photoelectric conversion portion is fed to an output signal line; and
   an integrator circuit that integrates the electric signal output from the photoelectric conversion portion, the integrator circuit including a first transistor to which the electric signal output from the photoelectric conversion portion is fed and a capacitive element connected to the first transistor so that the signal integrated by the integrator circuit is fed by way of the lead-out path to the output signal line; and
   a controller that detects a variation in sensitivity of the photoelectric conversion portion of each pixel by injecting an electric charge into the photoelectric conversion portion.

29. An image-sensing apparatus as claimed in claim 28, wherein the pixels further comprise a second transistor that turns on and off the electric signal output to the output signal line.

30. An image-sensing apparatus as claimed in claim 28, wherein the pixels further comprise a third transistor that amplifies the electric signal output from the photoelectric conversion portion.

31. An image-sensing apparatus as claimed in claim 28, further comprising a load resistor or a constant-current source connected to the output signal line.

32. An image-sensing apparatus as claimed in claim 28, wherein each pixel, when performing image sensing, operates selectively either in a first state in which the photoelectric conversion portion converts the electric signal linearly or in a second state in which the photoelectric conversion portion converts the electric signal natural-logarithmically.

33. A method for detecting sensitivity of a photoelectric conversion portion of a pixel within an image-sensing apparatus, the method comprising the steps of:
- injecting an electric charge into the photoelectric conversion portion of the pixel;
- discharging a portion of the thus injected electric charge for a predetermined period of time; and
- detecting an electric charge remaining in the photoelectric conversion portion of the pixel,
- wherein the electric charge remaining in the photoelectric conversion portion of the pixel is proportional to a threshold voltage of a transistor within the photoelectric conversion portion of the pixel.

34. A method for detecting sensitivity as claimed in claim 33, wherein the step of injecting the electric charge includes changing a voltage applied to the photoelectric conversion portion of the pixel.

35. A method for detecting sensitivity as claimed in claim 33, wherein the steps of injecting the electric charge, discharging a portion of the thus injected electric charge, and detecting an electric charge are repeated for each pixel in the image-sensing apparatus.

36. A method for detecting sensitivity as claimed in claim 33, wherein the photoelectric conversion portion of the pixel is not exposed to uniform light.

* * * * *